(12) United States Patent
Ochi

(10) Patent No.: US 7,782,115 B2
(45) Date of Patent: Aug. 24, 2010

(54) VOLTAGE LEVEL SHIFTER

(75) Inventor: Sam Seiichiro Ochi, Saratoga, CA (US)

(73) Assignee: ASIC Advantage Inc., Sunnyvale, CA (US)

( * ) Notice: Subject to any disclaimer, the term of this patent is extended or adjusted under 35 U.S.C. 154(b) by 0 days.

(21) Appl. No.: 12/422,060

(22) Filed: Apr. 10, 2009

(65) Prior Publication Data

US 2009/0256617 A1 Oct. 15, 2009

Related U.S. Application Data

(60) Provisional application No. 61/045,208, filed on Apr. 15, 2008, provisional application No. 61/044,113, filed on Apr. 11, 2008.

(51) Int. Cl.
*H03L 5/00* (2006.01)

(52) U.S. Cl. .......................... 327/333; 326/68

(58) Field of Classification Search ................. 327/333, 327/63, 68, 80, 81, 71
See application file for complete search history.

(56) References Cited

U.S. PATENT DOCUMENTS

| 5,627,489 | A | 5/1997 | Jochum | |
|---|---|---|---|---|
| 6,366,482 | B1 | 4/2002 | Jeong | |
| 7,245,152 | B2 * | 7/2007 | Wich | 326/63 |
| 7,310,012 | B2 * | 12/2007 | Chen | 327/333 |
| 7,629,830 | B1 * | 12/2009 | Rubin | 327/333 |
| 7,671,657 | B1 * | 3/2010 | Chen et al. | 327/333 |
| 7,679,418 | B2 * | 3/2010 | Vlasenko | 327/333 |
| 2007/0057898 | A1 | 3/2007 | Nakajima | |

FOREIGN PATENT DOCUMENTS

| JP | 2000-228628 A | 8/2000 |
|---|---|---|
| WO | WO 2007-100193 A1 | 9/2007 |

OTHER PUBLICATIONS

International Application No. PCT/US2009/040271, International Search Report dated Nov. 24, 2009, 3 pages.

\* cited by examiner

*Primary Examiner*—Lam T Mai
(74) *Attorney, Agent, or Firm*—Townsend and Townsend and Crew LLP

(57) ABSTRACT

Methods, systems, and devices are described for providing voltage level shifting that may operate reliably and at low power, even at high voltages and/or high switching frequencies. Embodiments receive an input signal representing input information, and effectively generate two voltage responses as a function of the input signal. Each voltage response includes exponential terms as a function of resistive and capacitive loading effects of components of the embodiments. A combined response signal is generated substantially as a superposition of the first response signal and the second response signal. A high-side driver signal is then generated as a function of the combined response signal, such that the high-side driver signal substantially preserves the input information represented by the input signal, and such that the first exponential response and the second exponential response are substantially absent from the high-side driver signal.

24 Claims, 11 Drawing Sheets

VOLTAGE LEVEL SHIFTER

CROSS-REFERENCES

This application claims priority from U.S. Provisional Patent Application No. 61/044,113, filed Apr. 11, 2008, entitled "VOLTAGE LEVEL SHIFTER", and from U.S. Provisional Patent Application No. 61/045,208, filed Apr. 15, 2008, entitled "VOLTAGE LEVEL SHIFTER FOR ARBITRARY INPUT SIGNALS", both of which are hereby incorporated by reference, as if set forth in full in this document, for all purposes.

BACKGROUND

The present invention relates to integrated circuits in general and, in particular, to voltage level shifter circuits.

Many electronics applications use voltage level shifting and driver components to handle high-side circuitry. Some of these applications provide a high-side switch, where a load is switched at the high side (e.g., the voltage supply side) of a circuit. For example, when a low-power voltage source (e.g., a computer output, battery, etc.) is used to drive a potentially high-current load, it may be desirable to provide a high-side switch that uses the low-power voltage source as a control signal to switch on another (e.g., higher-power) voltage source connected to the load.

Other applications may use level shifting and driver components to convert a direct current ("DC") bus to an alternating current ("AC") voltage for driving an AC system. For example, some uninterrupted power supplies convert a DC bus voltage to a three-phase waveform for power backup functionality, some motor controllers convert one or more DC bus voltages into two- or three-phase control signals, and some solar cells convert generated DC voltages into AC voltages for standard household uses. Certain other applications convert an AC voltage to a DC bus, which may then be used to generate a switched voltage signal of one or more frequencies. For example, when using a "Class D" audio amplifier to drive speakers, it may be desirable to increase the frequency of the amplifier, which may in turn decrease certain types of distortion (e.g., by effectively increasing the sampling rate).

Certain limitations of many voltage level shifting circuits, however, may prevent the reliable operation of these types of applications at high voltages and/or at high switching frequencies. One limitation is that the types of components in the circuit may generate excessive heat at high voltages and/or high switching frequencies, which may cause thermal run-away. Another limitation is that the configuration of components in the circuit may allow noise-induced cross conduction, which may short the DC bus voltage to ground. Either thermal run-away or shorting the DC bus to ground may, in some cases, cause permanent damage to the components and/or the packaging of the circuit.

As such, it may be desirable to provide voltage level shifting that may operate reliably and at low power, even at high voltages and high switching frequencies.

SUMMARY

Among other things, methods, systems, and devices are described for providing voltage level shifting, while avoiding excessive power dissipation, cross-conduction, and/or other issues. Embodiments receive a two-level input signal representing input information, and effectively generate two voltage responses as a function of the input signal. The first voltage response includes a first exponential response defined substantially as a voltage across a parallel resistive-capacitive ("R-C") network in response to a switched current. The second voltage response includes a second exponential response defined substantially as a voltage across the parallel R-C network in response to a switched voltage applied across an attenuator network including a second capacitive load coupled in series with the first network. A combined response signal is generated substantially as a superposition of the first response signal and the second response signal. A high-side driver signal is then generated as a function of the combined response signal, such that the high-side driver signal substantially preserves the input information represented by the input signal, and such that the first exponential response and the second exponential response are substantially absent from the high-side driver signal.

In some embodiments, the first response is generated by: generating a first switching voltage signal and a second switching voltage signal as a function of the input signal; generating a first switching current signal as a function of the first switching voltage signal; and generating a second switching current signal as a function of the second switching voltage signal. The second response is generated as a function of the input signal by: when the second switching voltage signal is HIGH, building up a first charge reserve on a first precharging device and dumping at least a portion of a second charge reserve into the second current switching device; and, when the first switching voltage signal is HIGH, building up the second charge reserve on a second precharging device and dumping at least a portion of the first charge reserve into the first current switching device. In certain embodiments, the combined response signal is generated by receiving the first response signal and the second response signal differentially and isolating the first exponential response and the second exponential response substantially to a common mode of the combined response signal. The high-side driver signal is generated as a function of the combined response signal by rejecting the common mode of the combined response signal, such that the first exponential response and the second exponential response are substantially absent from the high-side driver signal.

In one set of embodiments, a system is provided for voltage level shifting. The system includes: an input module, operable to receive a two-level input signal representing input information, and to generate a first switching voltage signal and a second switching voltage signal as a function of the input signal; a current signal generator module, having: a first current switching device, operable to generate a first switching current signal as a function of the first switching voltage signal; a second current switching device, operable to generate a second switching current signal as a function of the second switching voltage signal; a first precharging device, coupled with the first current switching device and the second current switching device, and operable to build up a charge reserve when the second switching voltage signal is HIGH, and to dump at least a portion of the charge reserve into the first current switching device when the first switching voltage signal is HIGH; a second precharging device, coupled with the first current switching device and the second current switching device, and operable to build up a charge reserve when the first switching voltage signal is HIGH, and to dump at least a portion of the charge reserve into the second current switching device when the second switching voltage signal is HIGH; a voltage signal generator module, operable to generate a first voltage response as a function of the first switching current signal and to generate a second voltage response as a function of the second switching current signal; and a latching module, operable to generate a two-level latched signal as a function of the first voltage response and the second voltage response, such that the latched signal substantially preserves the input information represented by the input signal.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components (e.g., a lower-case character). If only the first reference label is used in the specification, the description is applicable to any one of the similar components having the same first reference label irrespective of the second reference label.

DETAILED DESCRIPTION

Among other things, systems, devices, and methods are described for providing voltage level shifting that may operate reliably and at low power, even at high voltages and/or high switching frequencies.

Many electronics applications use voltage level shifting, for example, with driver components to handle high-side circuitry. One set of applications provides a high-side switch, where a load is switched at the high side (e.g., the voltage supply side) of a circuit. For example, when a low-power voltage source (e.g., a computer output, battery, etc.) is used to drive a potentially high-current load, it may be desirable to provide a high-side switch that uses the low-power voltage source as a control signal to switch on another (e.g., higher-power) voltage source connected to the load.

Another set of applications uses level shifting and driver components to convert a direct current ("DC") bus to an alternating current ("AC") voltage for driving an AC system. For example, some uninterrupted power supplies convert a DC bus voltage to a three-phase waveform for power backup functionality, some motor controllers convert one or more DC bus voltages into two- or three-phase control signals, and some solar cells convert generated DC voltages into AC voltages for standard household uses. Certain other applications convert an AC voltage to a DC bus, which may then be used to generate a switched voltage signal of one or more frequencies. For example, when using a "Class D" audio amplifier to drive speakers, it may be desirable to increase the frequency of the amplifier, which may in turn decrease certain types of distortion (e.g., by effectively increasing the sampling rate).

Figure 1:
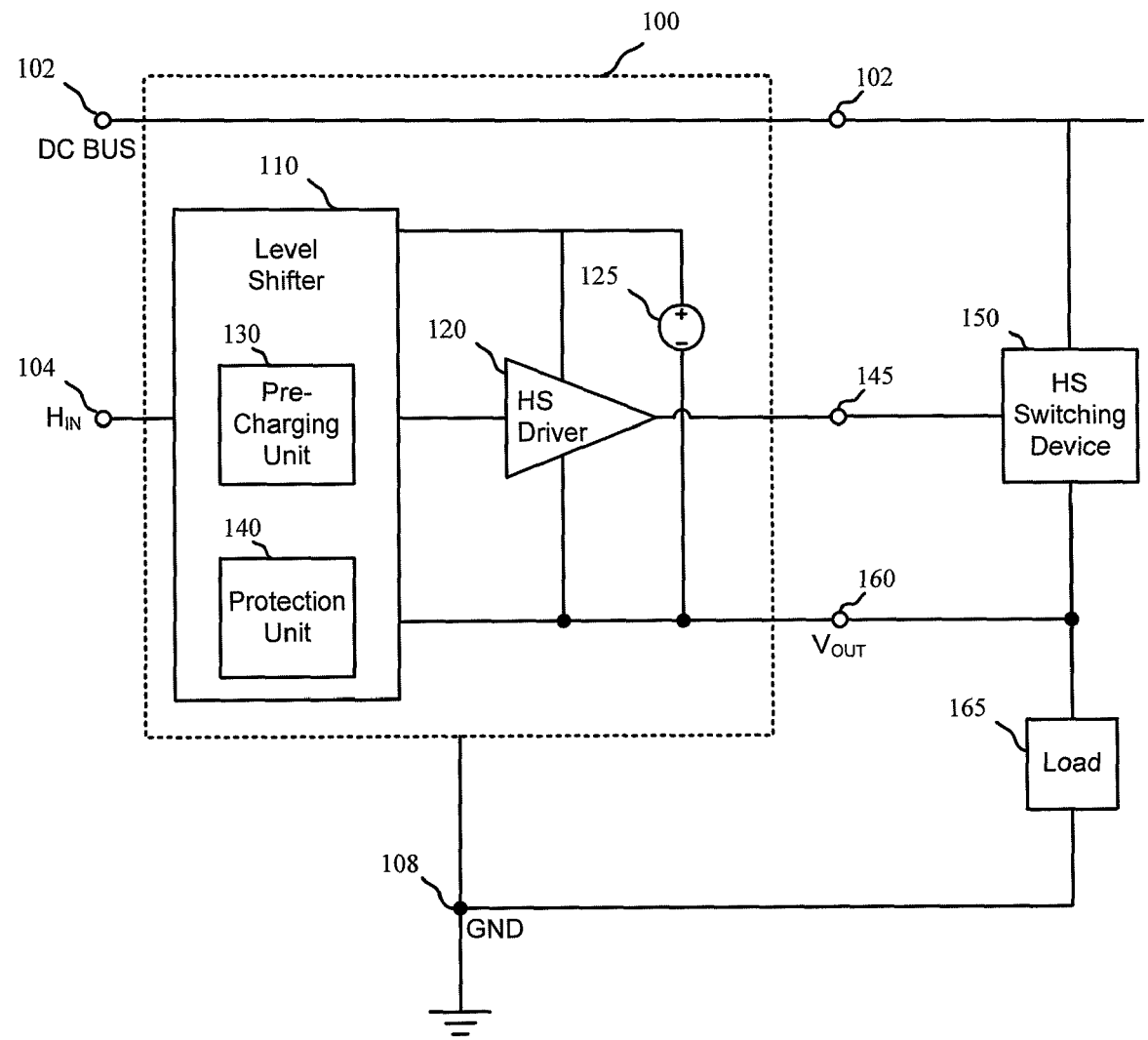
FIG. 1 shows a simplified block diagram of a system for using a voltage level shifter in an exemplary high-side switch configuration.

FIG. 1 shows a simplified block diagram of a system for using a voltage level shifter in an exemplary high-side switch configuration. The system includes a high-side switch 100 that receives a high-side control voltage 104 and drives a high-side switching device 150. The high-side switching device 150 is operable to switch an output voltage 160 across a load 165 between a bus voltage 102 and ground 108. The load may be any type of resistive and/or reactive load, including, for example, a lamp, motor, heating coil, etc. The high-side switching device 150 may be any compatible type of switching device, including a field effect transistor ("FET"), power metal-oxide FET ("power-MOSFET"), insulated gate bipolar transistor ("IGBT"), etc.

Some embodiments of the high-side switch 100 include a voltage level shifter unit 110. One function of the voltage level shifter unit 110 may be to provide and maintain the voltages and/or currents necessary to drive the high-side switching device 150 from the high-side control voltage 104. In one embodiment, the high-side switching device 150 is a FET, operable to be switched ON (i.e., to provide current to the load 165) substantially in its linear region when the gate-to-source voltage for the FET exceeds a threshold amount. Since the source of the FET is tied to the output voltage 160, the gate voltage of the FET may have to exceed the output voltage 160 by the threshold amount.

It is worth noting that, while the high-side switching device 150 is OFF, the output voltage 160 may be pulled to ground 108 (e.g., by the load 165). In this state, a voltage may have to be applied to the gate of the FET that exceeds ground 108 by the threshold amount to turn ON the high-side switching device 150. However, when the high-side switching device 150 is ON, the output voltage 160 may be pulled to the bus voltage 102 (e.g., 600 volts). In this state, the voltage applied to the gate of the FET may now have to exceed the bus voltage 102 by the threshold amount to keep the high-side switching device 150 ON. Embodiments include a high-side source 125, for example, for providing the extra voltage necessary to pull up the gate of the high-side switching device 150. For example, the top of the high-side source 125 may effectively provide a supply voltage for various components of the high-side switch 100 (e.g., with respect to the output voltage 160 level).

Embodiments of the high-side switch 100 also include a high-side driver unit 120. The high-side driver unit 120 may be implemented in any useful way, for example, including a transformer, discrete transistor, integrated circuit ("IC"), etc. The high-side driver unit 120 may provide a number of different functions, depending on the type of high-side switching device 150 and other components being used and/or the circuit configuration. Some embodiments of the high-side driver unit 120 generate a high-side switching signal 145 for driving the high-side switching device 150. In other embodiments, the high-side driver unit 120 controls high peak currents and heat dissipation generated by a power-MOSFET operating at high frequencies, as an isolation amplifier or short-circuit protector for an IGBT, to provide a continuous gate circuit for sustaining gate current in an IGBT, etc.

A number of components may be provided as part of, or in addition to, the voltage level shifter unit 110 to provide proper voltages and currents to the components in the system, like charge pumps, DC bias voltage buses, etc. For example, in certain embodiments, input logic is provided prior to the voltage level shifter unit 110 to interpret the high-side control voltage 104 and convert it into one or more signals for use by the voltage level shifter unit 110. In other embodiments, the voltage level shifter unit 110 includes components for mitigating or eliminating potentially undesirable operation of the high-side switch 100. For example, as explained in more detail below, using certain voltage level shifter unit 110 topologies to generate the high-side switching signal 145 may create certain undesirable conditions. One condition may be excessive power dissipation due, for example, to high switching currents used to support high switching frequencies. Another condition may be improper switching of certain components (e.g., flip-flops) due, for example, to noise.

In some embodiments, the voltage level shifter unit 110 includes a precharging unit 130 and/or a protection unit 140. Embodiments of the precharging unit 130 are configured to reduce the amount of current needed to maintain a given switching frequency of the high-side switching signal 145 by precharging certain switching devices. Embodiments of the protection unit 140 are configured to minimize improper switching of the high-side switching signal 145 due to noise. Some embodiments of the protection unit 140 are further configured to allow faster recovery from improper switching to minimize undesirable effects of the improper switching.

As shown, some embodiments of the voltage level shifter unit 110 include an input for receiving a low-side control voltage. When used in a high-side switch 100 configuration, the low-side control voltage may be provided by a voltage source (e.g., a bias voltage tied to ground 108). It will be appreciated that other components may be needed for proper circuit functioning, even though they are not shown. For example, certain components may have source voltage specifications (e.g., certain logic components may use 5-volt or 15-volt source voltages) or other specifications, as may be determined by certain design parameters or the use of other components.

Figure 2:
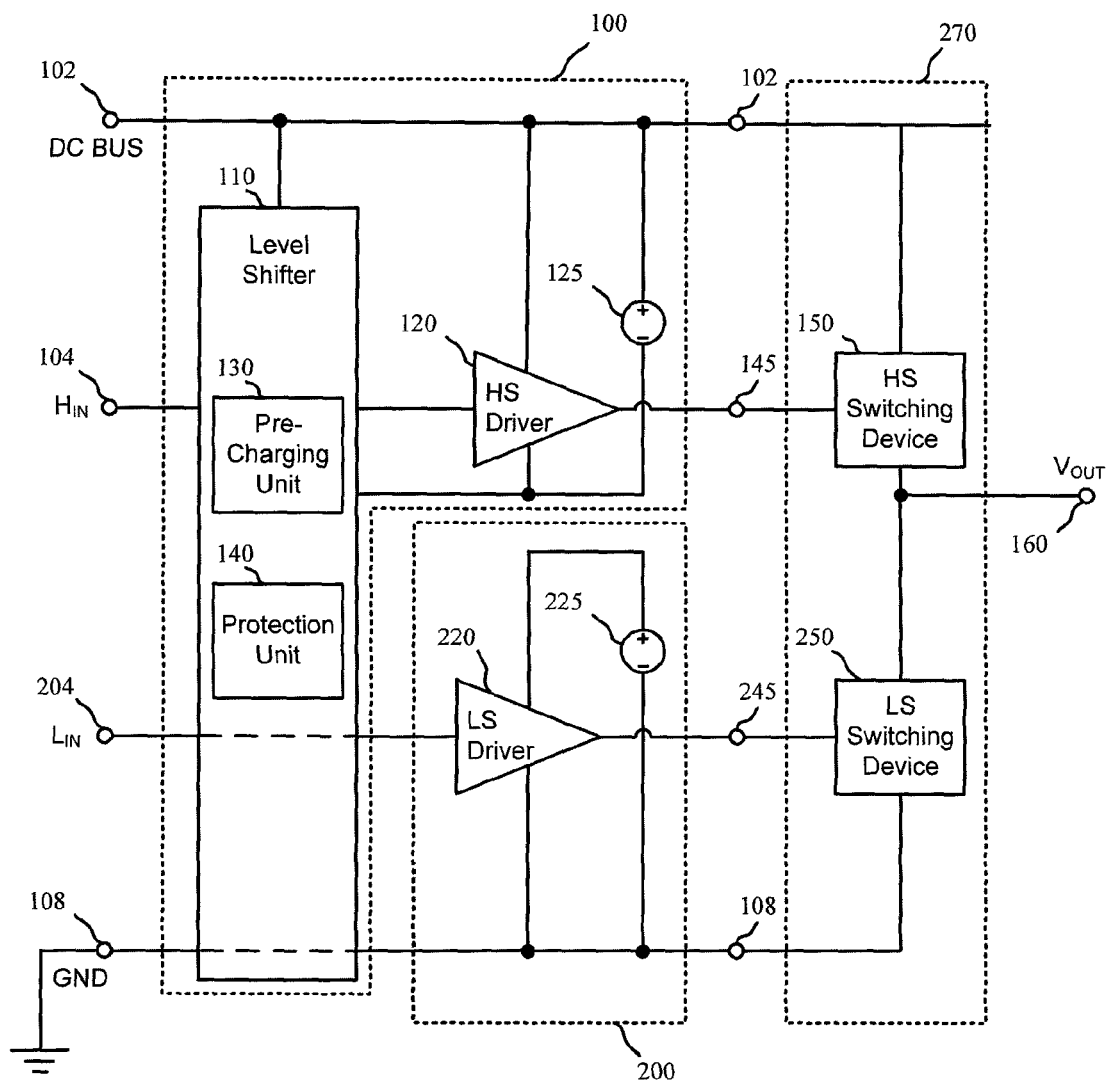
FIG. 2 shows a simplified block diagram of a system for using a voltage level shifter in an exemplary half-bridge configuration.

FIG. 2 shows a simplified block diagram of a system for using a voltage level shifter in an exemplary half-bridge configuration. The system includes a high-side switch 100 that receives a high-side control voltage 104 and drives a high-side switching device 150, and a low-side switch 200 that receives a low-side control voltage 204 and drives a low-side switching device 250. The high-side switching device 150 and the low-side switching device 250 are configured as a half-bridge 270; the high-side switching device 150 is tied between a bus voltage 102 and an output voltage 160 (e.g., an output voltage bus), and the low-side switching device 250 is tied between the output voltage 160 and ground 108. In this configuration, the half-bridge 270 may be operable to switch the output voltage 160 between the bus voltage 102 and ground 108.

In some embodiments, the high-side switch 100 is configured to operate like the high-side switch 100 of FIG. 1. Embodiments of the high-side switch 100 include a voltage level shifter unit 110 in communication with a high-side driver unit 120. In certain embodiments, the voltage level shifter unit 110 includes a precharging unit 130 and/or a protection unit 140, as described with reference to FIG. 1. The high-side driver unit 120 is configured to generate a high-side switching signal 145 for driving the high-side switching device 150.

In the half-bridge 270 configuration of FIG. 2, the low-side control voltage 204 may include a control voltage signal, rather than a bias voltage or other type of source (e.g., as may be the case in FIG. 1). The low-side control voltage 204 may be received by a low-side driver unit 220, configured to generate a low-side switching signal 245 for driving the low-side switching device 250. Certain embodiments of the low-side switch 200 further include a low-side source 225 for providing an appropriate source voltage to the low-side driver unit 220. Because the high-side control voltage 104 controls the high-side switching device 150 (e.g., by driving the high-side switch 100 to generate a high-side switching signal 145) and the low-side control voltage 204 controls the low-side switching device 250 (e.g., by driving the low-side switch 200 to generate a low-side switching signal 245), it may be preferable to configure the high-side control voltage 104 and the low-side control voltage 204 such that only one of the high-side switching device 150 or the low-side switching device 250 may be ON (e.g., conducting) at any given time.

If both the high-side switching device 150 and the low-side switching device 250 are ON at the same time, the bus voltage 102 may be shorted to ground 108. This may cause the circuit to malfunction, and may even cause permanent damage to one or more components. It will be appreciated that improper design of various components, and/or certain component characteristics, may cause the high-side switching device 150 and the low-side switching device 250 to be ON at the same time. For example, excessive propagation delay may adversely affect the timing between the high-side control voltage 104 and the low-side control voltage 204, or their propagation to their respective switching devices. In another example, noise and/or other artifacts in the system may cause premature switching of certain components, or other issues, which may result in the high-side switching device 150 and the low-side switching device 250 being ON at the same time. In some embodiments, the low-side control voltage 204 is the output of a controller unit (not shown), operable, for example, to limit propagation delay, control cross-conduction, etc.

In certain embodiments, both the high-side switching device 150 and the low-side switching device 250 are the same type of device (e.g., both are NMOS devices). In these embodiments, preventing the devices from being ON at the same time may involve preventing the high-side switching signal 145 and the low-side switching signal 245 from being HIGH at the same time. As such, in certain embodiments, the low-side control voltage 204 is an inverted version of the high-side control voltage 104 (e.g., the high-side control voltage 104 is passed through an inverter logic unit to generate the low-side control voltage 204).

In other embodiments, the high-side switching device 150 and the low-side switching device 250 are different types of devices. For example, as shown in FIG. 2, the high-side switching device 150 may be a PMOS device and the low-side switching device 250 may be an NMOS device. In these embodiments, preventing the devices from being ON at the same time may involve maintaining the high-side switching signal 145 and the low-side switching signal 245 in the same state. For example, when both the high-side switching signal 145 and the low-side switching signal 245 are HIGH, the high-side switching device 150 may be OFF and the low-side switching device 250 may be ON. As such, in certain embodiments, the low-side control voltage 204 and the high-side control voltage 104 may be synchronized, tied together, inverted and re-inverted, etc.

It is worth noting that using a PMOS device for the high-side switching device 150 (as in FIG. 2), as opposed to using an NMOS device for the high-side switching device 150 (as in FIG. 1), may require other adjustments to circuit topologies. For example, in the high-side switch 100 of FIG. 1, the high-side source 125 may provide a supply voltage for various components of the high-side switch 100 with respect to the output voltage 160 level. As shown in FIG. 2, however, the high-side source 125 effectively pulls down a reference level for components of the high-side switch 100 with respect to the DC bus level 102. For example, rather than using the output voltage 160 as a reference level and using the high-side source 125 to provide a higher source voltage level for the high-side switch 100, the high-side switch 100 components are not connected to the output voltage 160 and are connected instead directly to the DC bus voltage 102. Functionality relating to the topology of FIG. 2 is described further with reference to FIG. 3.

Figure 3:
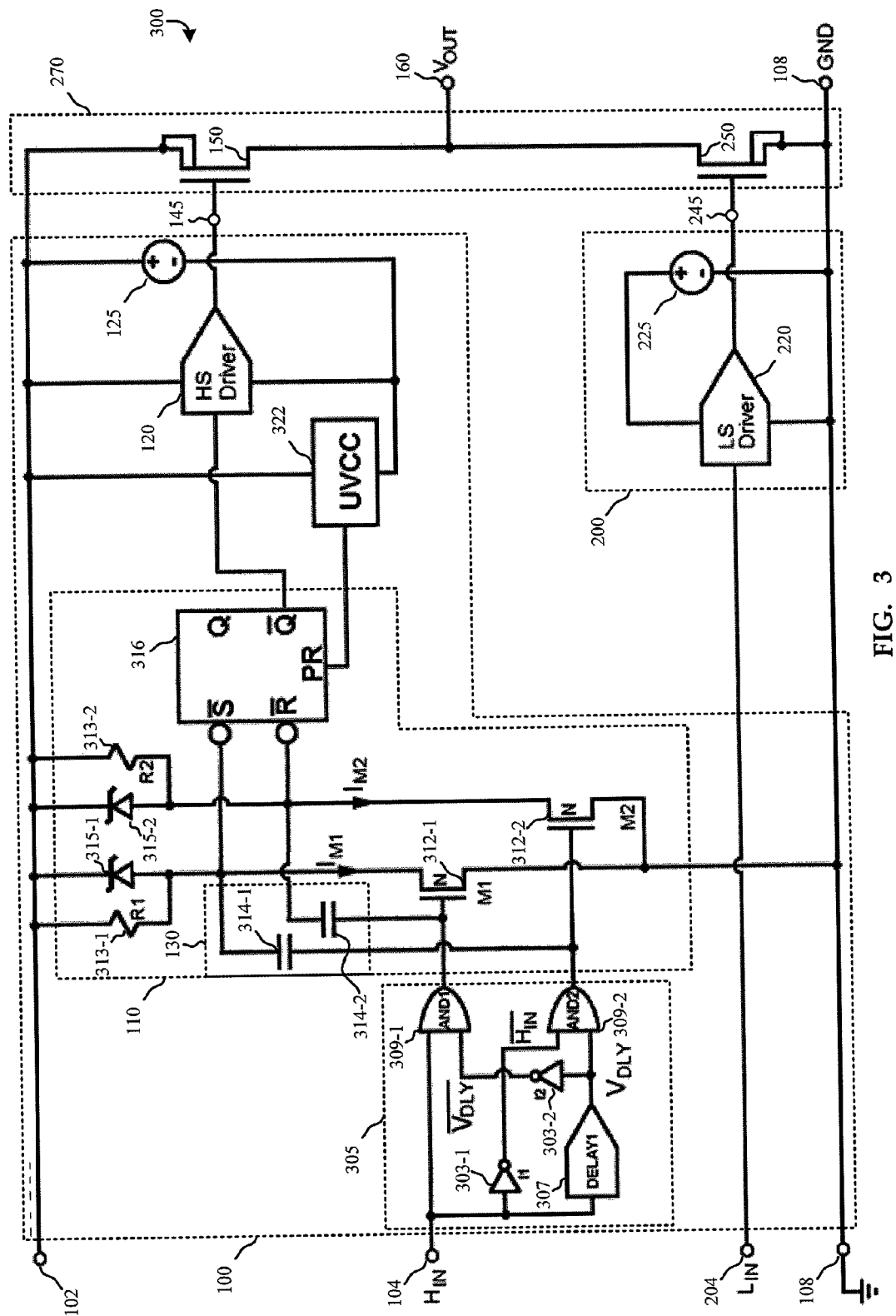
FIG. 3 shows a schematic view of an embodiment of a system for using a voltage level shifter in an exemplary half-bridge configuration, like the one shown in FIG. 2.
Figure 4:
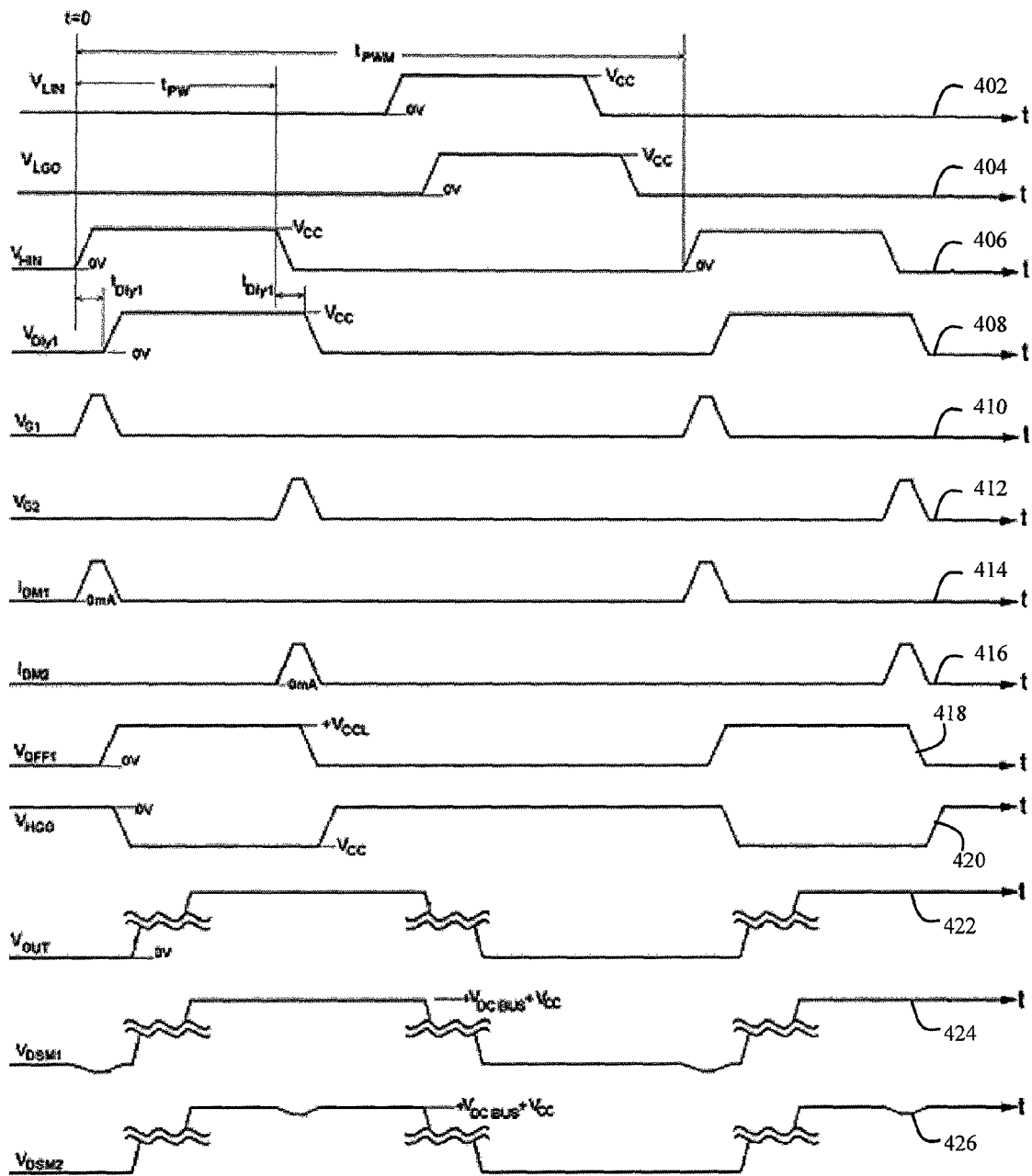
FIG. 4 shows graphs of exemplary waveforms of signals read at certain points in the system shown in FIG. 3.

FIG. 3 shows a schematic view of an embodiment of a system for using a voltage level shifter in an exemplary half-bridge configuration, like the one shown in FIG. 2. FIG. 4 shows graphs of exemplary waveforms of signals read at certain points in the system shown in FIG. 3. For added clarity, FIGS. 3 and 4 will be discussed in parallel.

The system 300 includes a high-side switch 100 that receives a high-side control voltage 104 and generates a high-side switching signal 145 for driving a high-side switching device 150 (e.g., a first power-MOSFET), and a low-side switch 200 that receives a low-side control voltage 204 and generates a low-side switching signal 245 for driving a low-side switching device 250 (e.g., a second power-MOSFET). The high-side switching device 150 and the low-side switching device 250 are configured as a half-bridge 270; the high-side switching device 150 is tied between a bus voltage 102 and an output voltage 160 (e.g., an output voltage bus), and the low-side switching device 250 is tied between the output voltage 160 and ground 108. In this configuration, the half-bridge 270 may be operable to switch the output voltage 160 between the bus voltage 102 and ground 108.

It will be appreciated by those of skill in the art that the waveforms illustrated herein (e.g., in FIG. 4) may be presented in ideal or simplified forms for added clarity. For example, where it does not materially add to the disclosure, the waveforms may be illustrated without delay, slope, slew rates, ringing, noise, etc. As such, the simplified nature of the illustrative waveforms should not be construed as limiting the scope of the invention in any way.

The low-side control voltage 204 is shown in the first graph 402 of FIG. 4, as a square wave, going from zero volts to a supply voltage ("$V_{CC}$"). The low-side control voltage 204 is passed through a low-side switch 200, including a low-side driver 220 energized by a low-side driver source 225 (e.g., a 15-volt DC). The output of the low-side driver 220 is used to switch the gate voltage of the low-side switching device 250. This low-side gate voltage signal may be substantially equivalent to the low-side control voltage 204, with some propagation delay, as shown in the second graph 404. It will be appreciated that, based on properties of the low-side driver source 225 and other components, the low-side gate voltage signal may differ from the low-side control voltage 204 in amplitude or other parameters.

The high-side control voltage 104 may be received by an input logic block 305, which includes a number of logic units. In some embodiments, the high-side control voltage 104 is a square wave, going from zero volts to a supply voltage ("$V_{CC}$"), as shown in the third graph 406 of FIG. 4. As shown, the input logic block 305 includes inverter blocks 303, delay blocks 307 and AND logic blocks 309. The input logic block 305 may convert the high-side control voltage 104 into three additional control signals: an inverted high-side control voltage, a delayed high-side control voltage, and an inverted delayed high-side control voltage. The inverted high-side control voltage may be substantially an inverted version of the high-side control voltage 104; the delayed high-side control voltage may be substantially a delayed version of the high-side control voltage 104 (e.g., as shown in the fourth graph 408 of FIG. 4); and the inverted delayed high-side control voltage may be substantially an inverted version of the delayed high-side control voltage.

In the embodiment shown in FIG. 3, the inverted high-side control voltage is generated by passing the high-side control voltage 104 through a first inverter block 303-1. The delayed high-side control voltage is generated by passing the high-side control voltage 104 through the delay block 307. The inverted delayed high-side control voltage is generated by passing the delayed high-side control voltage through a second inverter block 303-2. The high-side control voltage 104 and the inverted delayed high-side control voltage are passed to a first AND logic block 309-1 to generate a first current switching signal. The inverted high-side control voltage and the delayed high-side control voltage are passed to a second AND logic block 309-2 to generate a second current switching signal.

In some embodiments, the voltage level shifter unit 110 includes a first transistor 312-1 and a second transistor 312-2. In one embodiment, the two transistors are low current, high voltage NMOS devices, both capable of withstanding the full bus voltage 102 (e.g., 600V between the drain and source of the transistor). The gate of the first transistor 312-1 is driven with respect to its source (at ground 108) by the first current switching signal. The gate of the second transistor 312-2 is driven with respect to its source (at ground 108) by the second current switching signal.

The gate voltages of the first transistor 312-1 and the second transistor 312-2 (e.g., the first current switching signal and the second current switching signal) are shown in the fifth graph 410 and sixth graph 412 of FIG. 4, respectively. It is worth noting that the gate voltages of the first transistor 312-1 and the second transistor 312-2 are substantially pulse signals, each having a pulse width affected by the amount of delay between the high-side control voltage 104 and the delayed high-side control voltage. In one embodiment, the pulses are narrow pulses, each having a pulse width of approximately fifty nanoseconds. When either the first transistor 312-1 or the second transistor 312-2 is driven by the fifty-nanosecond pulse, it may conduct approximately fifty milliamps during the time the pulse is in its HIGH state, as shown in the seventh graph 414 and the eighth graph 416 of FIG. 4, respectively.

It will be appreciated that there are many ways to generate pulse inputs for turning ON the two transistors, the first transistor 312-1 and the second transistor 312-2. In certain embodiments, however, it may be important to ensure that the current switching signals are not HIGH at the same time, such that the first transistor 312-1 and the second transistor 312-2 are not ON at the same time. For example, turning the first transistor 312-1 and the second transistor 312-2 ON at the same time may cause SET and RESET inputs of a flip-flop (e.g., 316) to be high at the same time, which may cause undesirable results, like causing the high-side switching device 150 to switch ON while the low-side switching device 250 is ON. It will be further appreciated that these and other undesirable results may be caused by artifacts of the circuit design, like dV/dt transitions, propagation delays, noise, cross-conduction, etc.

In one embodiment, when the high-side control voltage 104 goes HIGH, the gate of the first transistor 312-1 is driven to +15 volts (e.g., HIGH) for fifty nanoseconds, thereby conducting fifty milliamps. This fifty-milliamp current is converted to a negative going voltage across a first resistor 313-1, which is clamped by a first zener diode 315-1. This clamped voltage drives the SET-bar input of a set-reset flip-flop 316. The Q-bar output of the set-reset flip-flop 316 may then go LOW. When the high-side control voltage 104 goes LOW, the gate of the second transistor 312-2 is driven to +15 volts (e.g., HIGH) for fifty nanoseconds, thereby conducting fifty milliamps. This fifty-milliamp current is converted to a second negative going voltage across a second resistor 313-2, which is clamped by a second zener diode 315-2. This second clamped voltage drives the RESET-bar input of the set-reset flip-flop 316. The Q-bar output of the set-reset flip-flop 316 may then go HIGH.

The Q-bar output waveform of the set-reset flip-flop 316 is shown in the ninth graph 418 of FIG. 4 as a square wave that substantially follows the high-side control voltage 104 (e.g., or an inverted version of the high-side control voltage 104) after some propagation delay. The Q-bar output signal may pass through a high-side driver 120, driven by a high-side source 125, configured to generate a high-side switching signal 145 for use in driving the gate voltage of the high-side switching device 150 (e.g., turning the high-side switching device 1500N or OFF). An embodiment of the high-side switching signal 145 is shown in the tenth graph 420 of FIG. 4 as a square wave that substantially follows the Q-bar output waveform after some propagation delay.

When the high-side switching signal 145 goes LOW, the high-side switching device 150 may turn ON (e.g., the high-side switching device 150 is shown as a PMOS device). In the ON state, the high-side switching device 150 may act substantially like a closed circuit, conducting current and pulling the output voltage 160 to the bus voltage 102. When the high-side gate driving voltage goes HIGH, the high-side switching device 150 may turn OFF. In the OFF state, the high-side switching device 150 may act substantially like an open circuit, preventing current from flowing. When the low-side gate voltage signal goes HIGH (as shown in the second graph 404 of FIG. 4), the low-side switching device 250 may turn ON (e.g., the low-side switching device 250 is shown as an NMOS device). In the ON state, the low-side switching device 250 may act substantially like a closed circuit, conducting current and pulling the output voltage 160 to ground 108. It will be appreciated that, depending on the load attached to the output voltage 160, parasitic capacitance of the devices, and other factors, the output voltage 160 may essentially remain at or near the bus voltage 102 until the voltage is sinked by the low-side switching device 250 or some other device. An embodiment of the output voltage 160 waveform is shown in the eleventh graph 422 of FIG. 4.

The twelfth graph 424 and the thirteenth graph 426 of FIG. 4 illustrate the drain-source voltages across the first transistor 312-1 and the second transistor 312-2, of the voltage level shifter unit 310, respectively. By examining the twelfth graph 424 in the context of the seventh graph 414, it may be seen that the first transistor 312-1 may typically be conducting current only when there is little or no drain-source voltage across the first transistor 312-1. As such, the pulse power whenever the first transistor 312-1 turns on may be relatively small (e.g., and may be ignored for many practical purposes).

However, by examining the thirteenth graph 426 in the context of the eighth graph 416, it may be seen that the second transistor 312-2 may typically be conducting current while the drain-source voltage across the second transistor 312-2 is approximately the full bus voltage 102 (or even higher). In some typical applications, the bus voltage 102 may be approximately 600 volts, and the pulse width of the gate voltage for the second transistor 312-2 may be approximately 50 ns, generating a pulse power of approximately thirty watts (i.e., 50 mA*600V). Many switching applications may desire to operate at switching frequencies of one Megahertz or higher. At a switching frequency one Megahertz, the average power dissipation of the second transistor 312-2 may be calculated as 1.5 watts (i.e., 30 W*50 ns*1 MHz). Because many integrated circuits may be rated to handle around 0.5 watts, this level of power dissipation may require special packaging technologies to maintain safe device operating temperatures without permanent device damage or destruction, when operating at these voltages and/or frequencies.

Particularly, components of the voltage level shifter unit 110 may manifest capacitive properties (e.g., stray capacitance). For example, each transistor 312 may manifest a so-called Miller capacitance, and the inputs to the set-reset flip-flop may manifest stray capacitance. As the transistors switch, voltage transitions in their respective current paths may be slowed by the capacitive effects on the resistor-capacitor ("R-C") time constant of the voltage level shifter unit 110.

This effect may be illustrated by analyzing components of the circuit in a simplified form as a switched current source (e.g., the transistors 312 driven by the current switching signals) driving a capacitive load, $C_L$ (e.g., the stray capacitances), in parallel with a resistive load, $R_L$ (e.g., resistors 313). The switched current source provides a current step signal that transitions from zero to a positive current value, $I_L$ at an initial time (t=0). A voltage step response for the voltage across the parallel network (e.g., the voltage across the resistive load and the capacitive load) may be calculated as:

$$V_{LJ}(t) = I_L * R_L * \left(1 - e^{-t*\left(\frac{1}{R_L*C_L}\right)}\right).$$

The voltage step response illustrates that the R-C time constant causes the voltage transition to occur over a period of time. It will be appreciated that, at least for this reason, higher switching currents may typically be used to ensure adequate bandwidth for supporting higher switching frequencies. These high currents may cause or exacerbate the power dissipation issues discussed above.

In some embodiments, the voltage level shifter unit 110 includes a precharging unit 130, configured to allow operation of the high-side switch 100 at high switching frequencies, while using lower currents. Reducing the amount of current needed may reduce the power dissipation of the circuit. This may, for example, allow the circuit to be used with standard IC processes (e.g., typically lower cost components and manufacturing processes). In some embodiments, the precharging unit 130 includes a first capacitor 314-1 and a second capacitor 314-2. The first capacitor 314-1 is connected between the SET-bar input of the set-reset flip-flop 316 (the drain of the first transistor 312-1) and the gate of the second transistor 312-2. The second capacitor 314-2 is connected between the RESET-bar input of the set-reset flip-flop 316 (the drain of the second transistor 312-2) and the gate of the first transistor 312-1.

In this configuration, the switched transistor 312 topology may be analyzed substantially as a switched voltage source with respect to the capacitors 314. For example, turning the first transistor 312-1 ON may cause the second capacitor 314-2 to charge. When the first transistor 312-1 is turned OFF, and the second transistor 312-2 is turned ON, stored charge in the second capacitor 314-2 may be dumped into the second transistor 312-2. In this way, the second capacitor 314-2 may effectively precharge the second transistor 312-2, which may offset stray capacitive effects. At the same time, turning the second transistor 312-2 ON may cause the first capacitor 314-1 to charge. When the second transistor 312-1 is turned OFF again, and the first transistor 312-1 is turned ON again, stored charge in the first capacitor 314-1 may be dumped into the first transistor 312-1.

These effects may be illustrated by analyzing components of the circuit in a simplified form, including the precharging unit 130, as a switched voltage source (e.g., the transistors 312 driven by the current switching signals) driving a first capacitive load, $C_1$ (e.g., the capacitors 314 in the precharging unit 130), in series with a parallel network having a second capacitive load, $C_2$ (e.g., the stray capacitances), in parallel with a resistive load, $R_L$ (e.g., resistors 313). The switched voltage source provides a voltage step signal that transitions from zero to some positive voltage value, $V_L$, at an initial time (t=0). The voltage step response of the voltage across the parallel network with the second capacitive load and the resistive load may be calculated as:

$$V_{LV}(t) = V_{IN}(t=0^+) * \left(\frac{C1}{C1+C2}\right) * \left(e^{-t*\left(\frac{1}{R_L*(C1+C2)}\right)}\right).$$

Again, the voltage step response illustrates that the R-C time constant causes the voltage transition to occur over a period of time. Notably, the current switching effects may cause the voltage step response to exponentially transition from zero volts to a steady state level over a time defined by the R-C time constant. However, the voltage switching effects may cause the voltage step response to exponentially transition from the steady state level to zero volts over substantially the same time defined by the R-C time constant. The topology shown in FIG. 3, including the precharging unit 130, may be configured to allow the voltage switching and current switching effects to effectively be superimposed (e.g., setting $C_1+C_2$ equal to $C_L$, and operating the components within their linear ranges). Superimposing the effects may illustrate that the precharging unit 130 can be used to offset stray capacitive effects of components of the voltage level shifter unit 110. For example, the superimposed effects may be calculated as follows:

$$V_L(t) = V_{LI}(t) + V_{LV}(t)$$
$$= \left[I_{IN}(t=0^+) * R_L * \left(1 - e^{-t*\left(\frac{1}{R_L*C_L}\right)}\right)\right] +$$
$$\left[V_{IN}(t=0^+) * \left(\frac{C1}{C_L}\right) * \left(e^{-t*\left(\frac{1}{R_L*C_L}\right)}\right)\right].$$

It will be appreciated that, according to the combined load voltage response equation just after the initial time (at t=0$^+$), the combined load voltage response may be calculated as:

$$V_L(t=0^+) = [I_{IN}(t=0^+) * R_L * (1-1)] +$$
$$\left[V_{IN}(t=0^+) * \left(\frac{C1}{C_L}\right) * (1)\right]$$
$$= V_{IN}(t=0^+) * \left(\frac{C1}{C_L}\right).$$

Further, according to the combined load voltage response equation at steady state (e.g., t=∞), the combined load voltage response may be calculated as:

$$V_L(t=\infty) = [I_{IN}(t=0^+) * R_L * (1-0)] +$$
$$\left[V_{IN}(t=0^+) * \left(\frac{C1}{C_L}\right) * (0)\right]$$
$$I_{IN}(t=0^+) * R_L.$$

Embodiments are configured to set the current through the transistor 312 paths (e.g., by sizing a resistor and a voltage source accordingly) such that:

$$I_{IN}(t=0^+) * R_L = V_{IN}(t=0^+) * \left(\frac{C1}{C_L}\right).$$

The result may then be calculated as:

$$V_L(t=0^-) = 0 \text{ and } V_L(t=0^+) = V_{IN}(t \geq 0^+) * \left(\frac{C1}{C_L}\right).$$

These equations illustrate that, by adding the voltage responses from the current switching circuit and the voltage switching circuit, a combined load voltage response may be generated that manifests essentially a step response attenuated by the ratio of $C1/C_L$ (e.g., the exponential terms of the individual responses may be effectively eliminated by adding the responses in this way). This may provide as least two features.

First, because the exponential effects of the individual responses may limit the bandwidth of the voltage level shifter unit 110. Including the precharging unit 130 of FIG. 3, however, may mitigate the exponential effects, which may allow operation of the voltage level shifter unit 110 at lower currents for a given switching frequency. As described above, high currents and/or switching frequencies may cause certain devices (e.g., the second transistor 312-2) to generate excessive self-heating, which may cause thermal run-away and possible permanent damage. Allowing operation at lower currents may, in effect, reduce or eliminate these power dissipation issues for certain applications.

Second, it may be desirable for the high-side switching signal 145 to manifest substantially a step response. Because the voltage response of the voltage level shifter unit 110 may include exponential terms (e.g., because of the exponential effects seen when the precharging unit 130 is not present), embodiments of high-side switches 100 use digital latching techniques (e.g., the set-reset flip-flop 316) to generate the step response. Use of digital latching devices, however, may cause certain undesirable results.

One such undesirable result is that the devices may be prone to noise-induced cross conduction, which may allow both the high-side switching device 150 and the low-side switching device 250 to be ON at the same time, potentially shorting the bus voltage 102 to ground 108. This cross conduction may, for example, be induced by dV/dt transient noise that exceeds some threshold value (e.g., typically around ±50V/ns) or by propagation delays. Further, because of the latching, it may be difficult or impossible to recover from the improper switching configurations (e.g., it may be necessary to wait for another switching cycle to effectively reset the set-reset flip-flop 316). Another such undesirable result is that the latching devices may manifest unpredictable conditions at startup. For example, without additional circuitry, the set-reset flip-flop 316 may start up in a condition that allows the high-side switching device 150 and the low-side switching device 250 to be ON at the same time. As such, some embodiments include an under-voltage lock-out unit 322 to cause the high-side switch 100 to start up in a predetermined, desirable condition. The extra circuitry may add complexity and/or expense to the fabrication of the circuit in some cases.

For at least these reasons, it may be desirable to avoid use of digital latching techniques and their associated devices. Notably, the superimposing effects of the precharging unit 130 may cause the voltage response of the voltage level shifter unit 110 to manifest a step response, as discussed above. This may indicate that an appropriate circuit configuration with an appropriately set bias current for the transistor 312 paths may be used to generate a high-side switching signal 145 that also manifests a step response, without using digital latching techniques, like the set-reset flip-flop 316.

Figure 5:
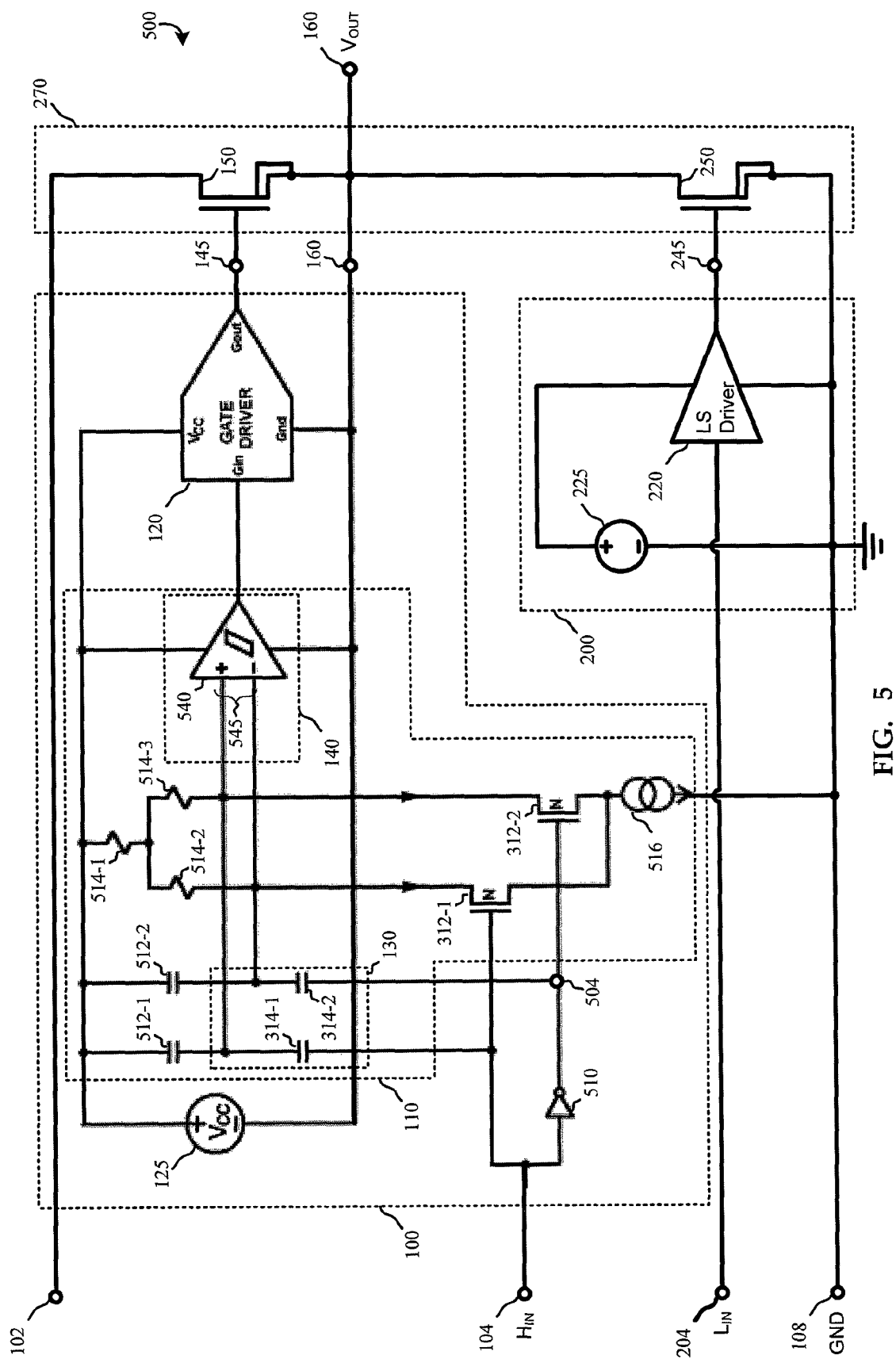
FIG. 5 shows a schematic view of an embodiment of a system for using a voltage level shifter for generating a combined voltage response in an exemplary half-bridge configuration, according to various embodiments of the invention.
Figure 6:
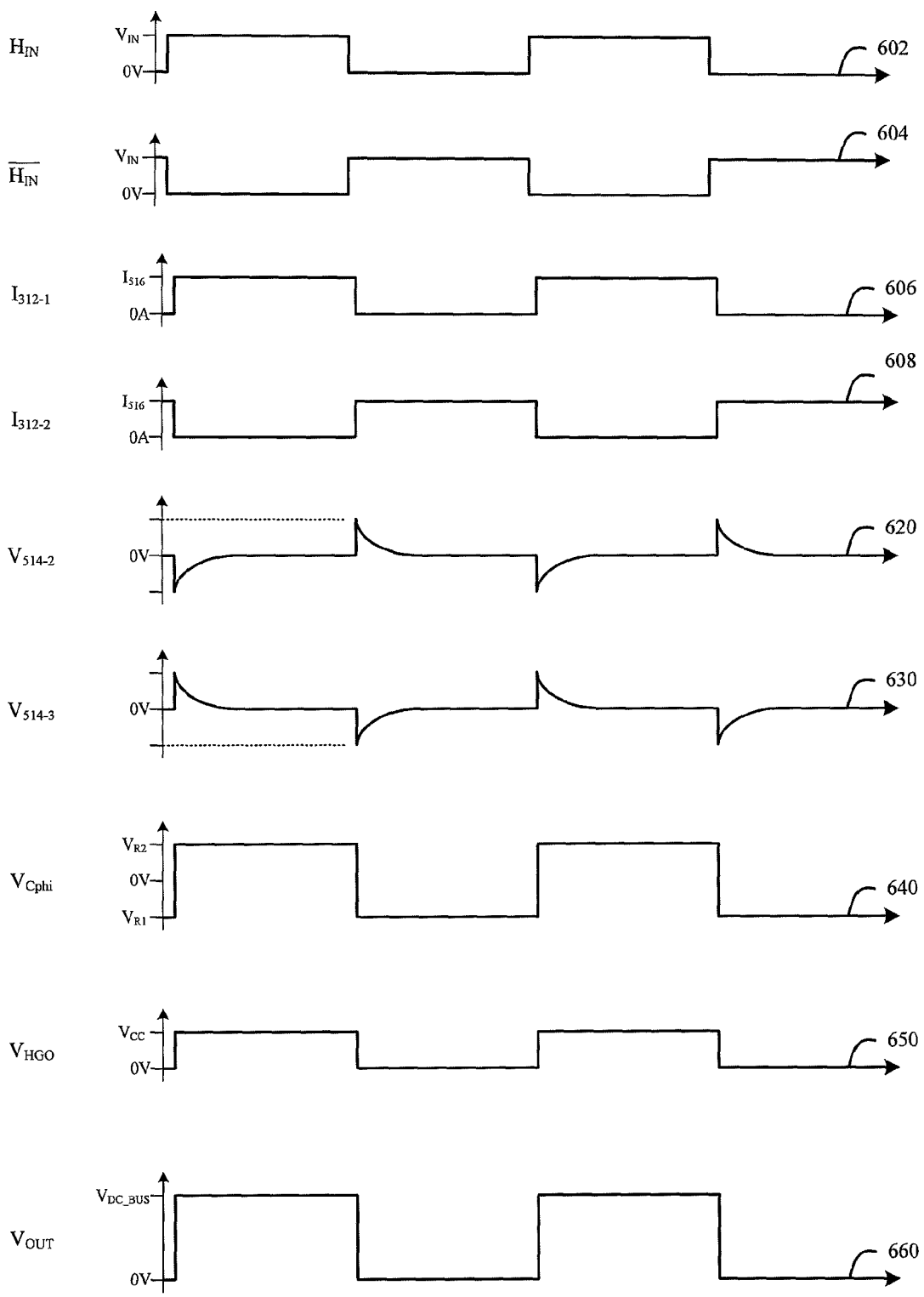
FIG. 6 shows graphs of exemplary waveforms of signals read at certain points in the system shown in FIG. 5.

FIG. 5 shows a schematic view of an embodiment of a system for using a voltage level shifter for generating a combined voltage response in an exemplary half-bridge configuration, according to various embodiments of the invention. As discussed below, the system 100 is optimized to exploit the combined load voltage response effects of using precharging units (e.g., the precharging unit 130 of FIG. 3). For example, the system 100 is shown to avoid use of digital latching techniques or their associated devices (e.g., there is no set-reset flip-flop 316 or under-voltage lock-out unit 322, as in the system 300 of FIG. 3). FIG. 6 shows graphs of exemplary waveforms of signals read at certain points in the system shown in FIG. 5. For added clarity, FIGS. 5 and 6 will be discussed in parallel.

The system 500 includes a high-side switch 100 that receives a high-side control voltage 104 and generates a high-side switching signal 145 for driving a high-side switching device 150 (e.g., a first power-MOSFET), and a low-side switch 200 that receives a low-side control voltage 204 and generates a low-side switching signal 245 for driving a low-side switching device 250 (e.g., a second power-MOSFET). The high-side switching device 150 and the low-side switching device 250 are configured as a half-bridge 270; the high-side switching device 150 is tied between a bus voltage 102 and an output voltage 160 (e.g., an output voltage bus), and the low-side switching device 250 is tied between the output voltage 160 and ground 108. In this configuration, the half-bridge 270 may be operable to switch the output voltage 160 between the bus voltage 102 and ground 108.

In some embodiments, the low-side control voltage 204 is a square wave, going from zero volts to a supply voltage ("$V_{CC}$"). The low-side control voltage 204 is passed through a low-side switch 200, including a low-side driver 220 energized by a low-side driver source 225 (e.g., a 15-volt DC source). The output of the low-side driver 220 is used to generate the low-side switching signal 245 for switching the gate voltage of the low-side switching device 250. In certain embodiments, the low-side switching signal 245 is substantially equivalent to the low-side control voltage 204, with some propagation delay. In other embodiments, the low-side switching signal may differ from the low-side control voltage 204 in amplitude or other parameters.

The high-side switch 100 includes a voltage level shifter unit 110 and a high-side gate driver 120. It will be appreciated by those of skill in the art that the configuration of the voltage level shifter unit 110 may essentially include functionality of two switching voltage sources and two switching current sources, with their effects superimposed, as described above. In some embodiments, the two switching voltage sources are provided by receiving a high-side control voltage 104 (e.g., a square wave) and passing the high-side control voltage 104 through an inverter 510 or other logic to generate an inverted high-side control voltage 504. Embodiments of the high-side control voltage 104 and the inverted high-side control voltage 504 are shown in the first graph 602 and the second graph 604 of FIG. 6, respectively. As shown, the control voltages may be square waves transitioning between zero volts and an input HIGH voltage level, "$V_{IN}$."

The high-side control voltage 104 and the inverted high-side control voltage 504 may then be used as two complementary switching voltage sources. In some embodiments, the two switching current sources are provided by using a pair of complementary transistors 312 connected to a current source 516. When each transistor 312 turns ON in turn, it may conduct current according to the current source 516. If the gates of the pair of transistors 312 are driven by complementary square wave voltage signals (e.g., the high-side control voltage 104 and the inverted high-side control voltage 504), the transistors 312 may generate essentially complementary square wave current signals. Embodiments of current through the first transistor 312-1 and the current through the second transistor 312-2 are shown in the third graph 606 and the fourth graph 608 of FIG. 6, respectively. As shown, the current signals may be square waves transitioning between zero amps and the bias current level provided by the current source 516.

In the embodiments shown in FIG. 5, the high-side control voltage 104 and the inverted high-side control voltage 504 are used as two switching voltage sources. Two transistors, the first transistor 312-1 and the second transistor 312-2 are provided, one side of each being connected to a current source 516 set to draw an amount of current (e.g., a bias current). The gate of the first transistor 312-1 is driven by the high-side control voltage 104 and the gate of the second transistor 312-2 is driven by the inverted high-side control voltage 504. In this configuration, the current waveforms of the first transistor 312-1 and the second transistor 312-2 may substantially follow the voltage waveforms of the high-side control voltage 104 and the inverted high-side control voltage 504, respectively.

It will be appreciated that, while this and other embodiments are described with reference to square wave control signals (e.g., the high-side control voltage 104), any arbitrary waveform and/or any arbitrary duty cycle is possible according to the invention. In one embodiment, the high-side control voltage 104 is a square pulse of 10%/90% duty cycle. The result may be a difference in direct current ("DC") offset from a 50% duty cycle square wave, which may vary as a function of the time constants (e.g., the resistor-capacitor time constant with respect to the repetition frequency). For example, if the time constant were ten nanoseconds for a pulse repetition frequency of 100 Kilohertz (i.e., a ten microsecond period), the offset may be negligible; but if the same ten-nanosecond time constant were applied to a ten Megahertz signal (i.e., a 100 nanosecond period), a DC offset may result between the pulses.

The voltage level shifter unit 110 may further include a first network of passive devices, including capacitor 314-1, capacitor 512-1, resistor 514-3, and resistor 514-1, and a second network of passive devices, including capacitor 314-2, capacitor 512-2, resistor 514-2, and resistor 514-1. In some embodiments, capacitor 314-1 and capacitor 314-2 are configured as a precharging unit 130; and, in certain embodiment, capacitor 512-1 and capacitor 512-2 are configured as attenuators. The high-side control voltage 104 and the current waveform generated by the second transistor 312-2 may be used to control the first network of passive devices, thereby generating a first combined response. The inverted high-side control voltage 504 and the current waveform generated by the first transistor 312-1 may be used to control the second network of passive devices, thereby generating a second combined response.

In one embodiment, the high-side control voltage 104 drives the gate of the first transistor 312-1 and the inverted high-side control voltage 504 drives the gate of the second transistor 312-2. A high going high-side control voltage 104 steers a tail current provided by the current source 516 (e.g., fifty micro-amps) through the first transistor 312-1, thereby driving a drain load resistor, resistor 514-2. The same current may flow through resistor 514-1, reaching a high-side source voltage terminal sitting at a voltage level generated by a high-side source 125. The high-side source 125 may generate a voltage level of "$V_{CC}$," and may be connected between the high-side source voltage terminal and an output voltage 160 level, such that the high-side source voltage terminal is maintained at a level of the output voltage 160 plus $V_{CC}$. A low going high-side control voltage 104 (i.e., a high-going inverted high-side control voltage 504) steers the current provided by the current source 516 through the second transistor 312-2, thereby driving a second drain load resistor, resistor 514-3. Again, the same current may flow through resistor 514-1, reaching the high-side source voltage terminal.

As the sourced current will either flow through resistor 514-2 when the first transistor 312-1 is turned on or through resistor 514-3 when the second transistor 312-2 is turned on, there may be a substantially constant current (e.g., substantially the full bias current provided by the current source 516) flowing through resistor 514-1. The value of resistor 514-1 may be chosen so that approximately half of the $V_{CC}$ voltage generated by the high-side source 125 will be dropped across resistor 514-1. The turning on of the first transistor 312-1 may cause a negatively going transient across resistor 514-2, and the turning off of the second transistor 312-2 may cause a positively going transient across resistor 514-2. These transients may be capacitively reinforced by capacitor 314-1 and capacitor 314-2. A negatively going transient may be reinforced by capacitor 314-2 as a result of the inverted high-side control voltage 504, and a positively going transient may be reinforced by capacitor 314-1 as a result of the non-inverted high-side control voltage 104.

For example, the voltage across resistor 514-2 may be calculated to produce a waveform like the one shown in the fifth graph 620 of FIG. 6. It will be appreciated that the voltage across resistor 514-3 may be calculated to produce a waveform that is essentially the complement of the one shown in the sixth graph 630 of FIG. 6. While the waveforms may include exponential terms, appropriately designing and implementing the voltage level shifter unit 110 circuit may allow the exponential terms of the voltage switching circuitry and the current switching circuitry to be isolated to the common mode of the first combined response (e.g., graph 620) and the second combined response (e.g., graph 630).

Embodiments are configured so that the common mode exponential terms may be effectively rejected by using the signals differentially. The differential response 545 (e.g., the voltage seen differentially at the inputs to a hysteresis comparator 540) may look like the waveform shown in the seventh graph 640 of FIG. 6. As shown in the seventh graph 640, the hysteresis comparator 540 effectively sees a step response at its input with substantially no exponential terms. This may be a result of the common mode rejection capabilities of the hysteresis comparator 540. For example, the hysteresis comparator 540 may have a high characteristic common mode rejection ratio, allowing the device to recognize small changes in the desirable portion of the differential input voltage, while rejecting relatively large fluctuations in the common mode of the differential input voltage. In this way, the hysteresis comparator 540 may be configured as a protection unit 140.

In some embodiments, the protection unit 140 can be further construed as including capacitor 512-1 and capacitor 512-2. For example, actual fluctuations in source voltage 102 levels may be much larger than the common mode rejection capabilities of the hysteresis comparator 540. However, capacitor 512-1 and capacitor 512-2 may be configured (e.g., their values may be selected) to attenuate the effects seen at the different inputs of the hysteresis comparator 540, for example, by a factor of 100. It is worth noting that the differential response 545 is essentially a bi-polar step response (e.g., going from the negative voltage drop across resistor 514-2 to the positive voltage drop across resistor 514-3) that substantially follows the combined load voltage response equation derived above.

In some embodiments, the differential response 545 is used to differentially drive the hysteresis comparator 540. The hysteresis comparator 540 may be operable to compare the voltages at its two inputs. When its positive input voltage exceeds its negative input voltage by some positive threshold amount, the hysteresis comparator 540 may output a logical HIGH voltage; and when its negative input voltage exceeds its positive input voltage by some negative threshold amount, the hysteresis comparator 540 may output a logical LOW voltage. It is worth noting that the positive threshold value and the negative threshold value may be set at any practical and useful voltage for different reasons. For example, it may be desirable to set either or both of the positive threshold value and the negative threshold value to avoid undesirable transitions due to noise in the system (e.g., dV/dt noise).

The output of the hysteresis comparator 540 may be communicated to the high-side driver 120 to generate a high-side switching signal 145. Embodiments of the high-side driver 120 are connected between the output voltage 160 and the high-side source voltage terminal. The high-side driver 120 may be configured to provide an appropriate level for switching the high-side switching device 150 as a function of the output of the comparator. An embodiment of the high-side switching signal 145 is shown in the eighth graph 650 of FIG. 6. Embodiments of the high-side switching signal 145 may be complementary signals to embodiments of the low-side switching signal 245.

The high-side switching signal 145 may be used to drive the gate of the high-side switching device 150 and the low-side switching signal 245 may be used to drive the gate of the low-side switching device 250. In this configuration, the high-side switching signal 145 and the low-side switching signal 245 may essentially control the half-bridge 270 to switch the output voltage 160 between the bus voltage 102 and ground 108. An embodiment of the output voltage 160 may look like the waveform shown in the ninth graph 660 of FIG. 6.

It will be appreciated that certain component values (or ratios) may be selected to provide certain results. For example, the value of the differential response may be set (e.g., as a result of capacitor 314-1 and capacitor 314-2) to be substantially equal to the current provided by the current source 516 ("$I_{BIAS}$") times the value of the resistor 514-2. This may result in little or no delay between the high-side control voltage 104 and the differential response (e.g., due to the first transistor 312-1, the second transistor 312-2, and their associated parasitic substrate capacitances). As another example, component ratios may be set such that:

$$\frac{V_{DC\_BUS}}{\frac{1}{2}V_{CC}} = \frac{C_{314-1}}{C_{512-1}} = \frac{C_{512-2}}{C_{314-2}} = \frac{V_{CC}}{I_{BIAS} * R_{514-2}} \le K,$$

where K is a constant value.

In some embodiments, delay between the high-side control voltage 104 and the output voltage 160 (input-to-output delay) may be primarily due to response delay of the comparator. As is known in the art, comparator delay may decrease exponentially as its input overdrive is increased. Setting $V_{CC}$ to fifteen volts and K to 100, for example, the differential response 145 (i.e., the differential input to the hysteresis comparator 540) may be calculated as 300 millivolts. Further, using a bus voltage of 600 volts and setting K to 100 may cause an induced common mode response seen at the input of the comparator to be calculated as approximately six volts (i.e., $V_{BUS}/100=600V/100$), and the lowest input common mode voltage to be calculated as 1.6 volts (i.e., $(V_{CC}/2)-(V_{BUS}/101)=7.5-5.9$). These values may be kept well within a rated input range of the comparator.

It will be further appreciated that the power dissipation of the voltage level shifter unit 110 may essentially be calculated as the time either the first transistor 312-1 or the second transistor 312-2 is on and is experiencing the full bus voltage 102 (e.g., 600V). A worst case may be when the output voltage 160 is pulled to the bus voltage 102 for most of each cycle of the high-side control voltage 104. In this case, the power dissipation may essentially be calculated as thirty milliwatts (i.e., 50 µA*600V). It is worth noting that thirty milliwatts may be well within many standard IC package technologies for self-dissipation of heat with simple convection cooling techniques, as known in the art.

It will now be appreciated by those of skill in the art that using a voltage level shifter unit, like the voltage level shifter unit 110 shown in FIG. 5, may avoid some of the undesirable results inherent with digital latching techniques. In one example, the low power dissipation may avoid the thermal runaway experienced by some digitally latched voltage level shifters used at high voltages and/or frequencies. In another example, because the power dissipation is apparently independent of (or constant with) frequency, using the device at high switching frequencies may not generate excessive heat. In yet another example, because the device does not use a digitally latched technique, it may be self-correcting after experiencing any temporary noise transients beyond its rated dV/dt. As such, the device may be able to accept dV/dt transitions of plus or minus fifty volts-per-nanosecond, or higher, without error. In still another example, the configuration of the circuit may eliminate the need for an under-voltage lockout circuit, which may reduce the cost and/or complexity of the circuit implementation.

Figure 7:
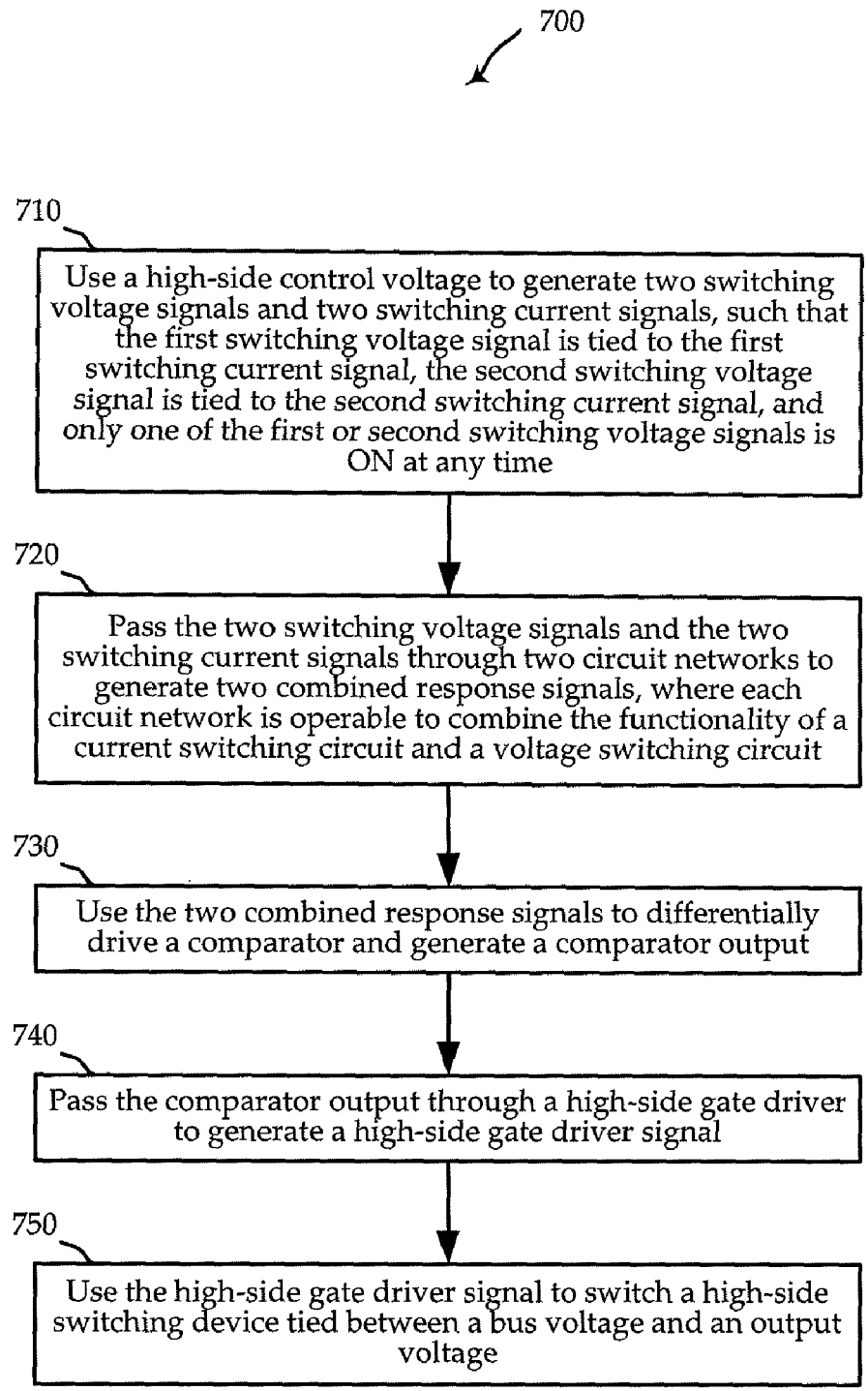
FIG. 7 shows a flow diagram of embodiments of voltage level shifting, according to various embodiments of the invention.

FIG. 7 shows a flow diagram of more specific embodiments of voltage level shifting, according to various embodiments of the invention. The method 700 may begin by receiving a high-side control voltage. At block 710, the high-side control voltage is used to generate two switching voltage signals and two switching current signals. The first switching voltage signal may be tied to the first switching current signal, and the second switching voltage signal may be tied to the second switching current signal. The two switching voltage signals may be configured so that only one of the first or second switching voltage signals is ON at any time.

At block 720, the two switching voltage signals and the two switching current signals are passed through two circuit networks to generate two combined response signals. Each of the circuit networks may be operable to combine the functionality of a current switching circuit and a voltage switching circuit, such that each combined response signal is effectively a combination of a response signal from a current switching circuit and a response signal from a voltage switching circuit. The two combined response signals are used in block 730 to differentially drive a comparator and generate a comparator output. The comparator output is passed through a high-side gate driver at block 740 to generate a high-side gate driver signal. The high-side gate driver signal is used at block 750 to switch a high-side switching device. In some embodiments, the high-side switching device is configured for use as a high-side switch. In other embodiments, the high-side switching device is configured for use as part of a half bridge.

Voltage Level Shifter Embodiments for Arbitrary Input Signals

The embodiments described above with reference to FIGS. 1-7 are optimized for handling two-level (e.g., digital) signals. For example, various embodiments include logic units, switching signals, and other digital types of implementations. It may be desirable, in some applications to level shift arbitrary (e.g., analog) input signals. Embodiments described with reference to FIGS. 8-11 provide voltage level shifting functionality for arbitrary input signals. In some embodiments, the level-shifted output may accurately represent the arbitrary input signal information even in the context of an unstable reference.

Many electronics applications use voltage level shifting as part of detection and/or isolation circuitry. Some of these applications provide circuitry that detects or receives signals from one system with one reference voltage, and level shifts the signal to another system with another reference voltage. For example, it may be desirable to use a small-signal input voltage to provide information to a relatively high-voltage system. To ensure that the information from the small signal voltage may be used by the high-voltage system, it may be necessary to level shift the voltage. Level shifting the voltage may help, for example, to reject large-signal common-mode voltages that may interfere with the accurate detection of the small-signal information. Further, level shifting the voltage may allow the small-signal system that generated the small-signal input voltage to be electrically isolated from the high-voltage system.

In one illustrative case, it is desirable to detect current passing into the motor of an electric vehicle. A current sensor may be placed in series with the motor input, such that a voltage signal is generated, the voltage signal being proportional to the input current to the motor. The full range of the generated voltage signal may typically be on the order of only a few volts. The generated voltage signal may be passed to a signal processing system configured to adjust certain vehicle parameters depending on the input current to the motor. The signal processing system may operate in an electrical environment where its reference voltage fluctuates by hundreds of volts. As such, the generated voltage signal may be essentially in the noise of the signal processing system, and the large voltage fluctuations of the signal processing system may adversely affect the motor input system if the systems are not isolated from each other. For these and/or other reasons, it may be desirable to voltage shift the generated voltage signal, such that the voltage shifted signal essentially rides on top of the fluctuating reference voltage of the signal processing system while remaining electrically isolated from the system that created the generated voltage signal.

Figure 8:
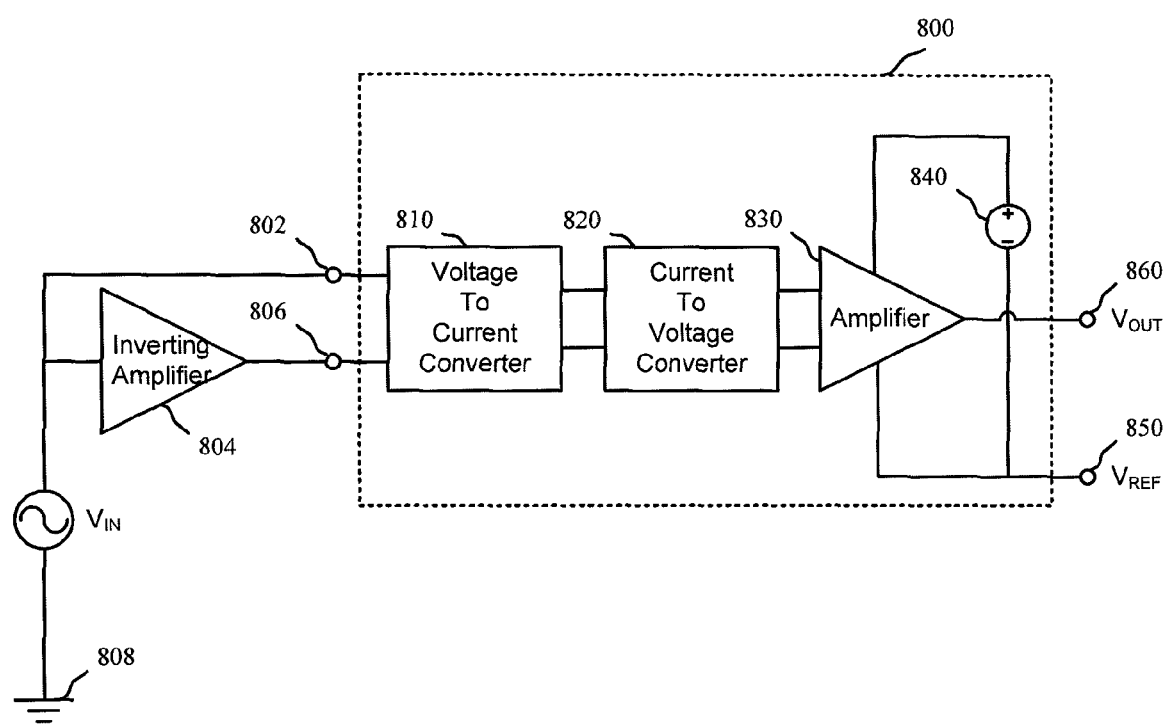
FIG. 8 shows a simplified block diagram of an illustrative voltage level shifter configured to accept arbitrary input signals, according to various embodiments of the invention.

FIG. 8 shows a simplified block diagram of an illustrative voltage level shifter configured to accept arbitrary input signals, according to various embodiments of the invention. The voltage level shifter 800 includes a voltage-to-current converter unit 810, a current-to-voltage converter unit 820, and a gain stage 830. The voltage level shifter 800 receives two complementary inputs, a voltage input signal 802, and an inverted voltage input signal 806, both with respect to a first reference voltage 808 (e.g., ground). In some embodiments, the inverted voltage input signal 806 is generated by transforming the voltage input signal 802. In one embodiment, the voltage input signal 802 is passed through an inverting amplifier 804 to generate the inverted voltage input signal 806. Other ways of generating complementary input signals are known in the art.

In some embodiments, the voltage input signal 802 and the inverted voltage input signal 806 are received by the voltage-to-current converter unit 810. The voltage-to-current converter unit 810 may transform the received voltage signals 802 and 806 into at least one current signal, representing the information from the received voltage signals 802 and 806. It will be appreciated that the transformation may cause the generated current signal(s) to differ from the received voltage signals 802 and 806, for example, in phase and/or amplitude.

The generated current signal(s) may then be received by the current-to-voltage converter unit 820. The current-to-voltage converter unit 820 may transform the generated current signal(s) into at least one generated voltage signal. The generated voltage signal(s) may represent the information from the current signal(s). As with the voltage-to-current converter unit 810, the transformation by the current-to-voltage converter unit 820 may cause the generated voltage signal(s) to differ from the generated current signal(s), for example, in phase and/or amplitude. In some embodiments, the transformation by the current-to-voltage converter unit 820 may substantially be the inverse of the transformation by the voltage-to-current converter unit 810.

The generated voltage signal(s) may be used to drive the gain stage 830 of the voltage level shifter 800 (e.g., differentially). In certain embodiments, the gain stage 830 includes a differential amplifier, while in other embodiments, the gain stage 830 includes an analog-to-digital converter. Other types of compatible gain stage components are known in the art. The output of the gain stage 830 may represent the difference between the voltages seen at its input terminals (e.g., the difference between two generated voltage signals). For example, the gain stage 830 may be driven in such a way as to effectively recreate the voltage input signal 802. The output of the gain stage 830 may then be used as a voltage output signal 860 of the voltage level shifter 800.

In certain embodiments, the gain stage 830 may provide additional functionality. One additional function of the gain stage 830 may be to affect the gain of its output (e.g., to amplify the voltage output signal 860). Another additional function of the gain stage 830 may be to help electrically isolate the voltage output signal 860 from the source of the voltage input signal 802 and/or other components. A third additional function of the gain stage 830 may be to provide impedance matching between the voltage level shifter 800 (or the source of the voltage input signal 802) and any other systems that may be electrically connected with the gain stage 830.

In some embodiments, the gain stage 830 is tied between a bias voltage and a reference voltage 850, via a bias voltage source 840. In certain embodiments, the reference voltage 850 is tied to a hard point (e.g., a ground reference), while in other embodiments, the reference voltage 850 floats. Because the gain stage 830 is referenced to the reference voltage 850, the voltage output signal 860 may float on the reference voltage 850. So long as the gain stage 830 has sufficient common-mode rejection capabilities, this may allow the gain stage 830 to effectively reject fluctuations in the reference voltage 850. This, in turn, may allow information from the voltage output signal 860 to be used without being affected by fluctuations in the reference voltage 850 in undesirable ways.

Figure 9:
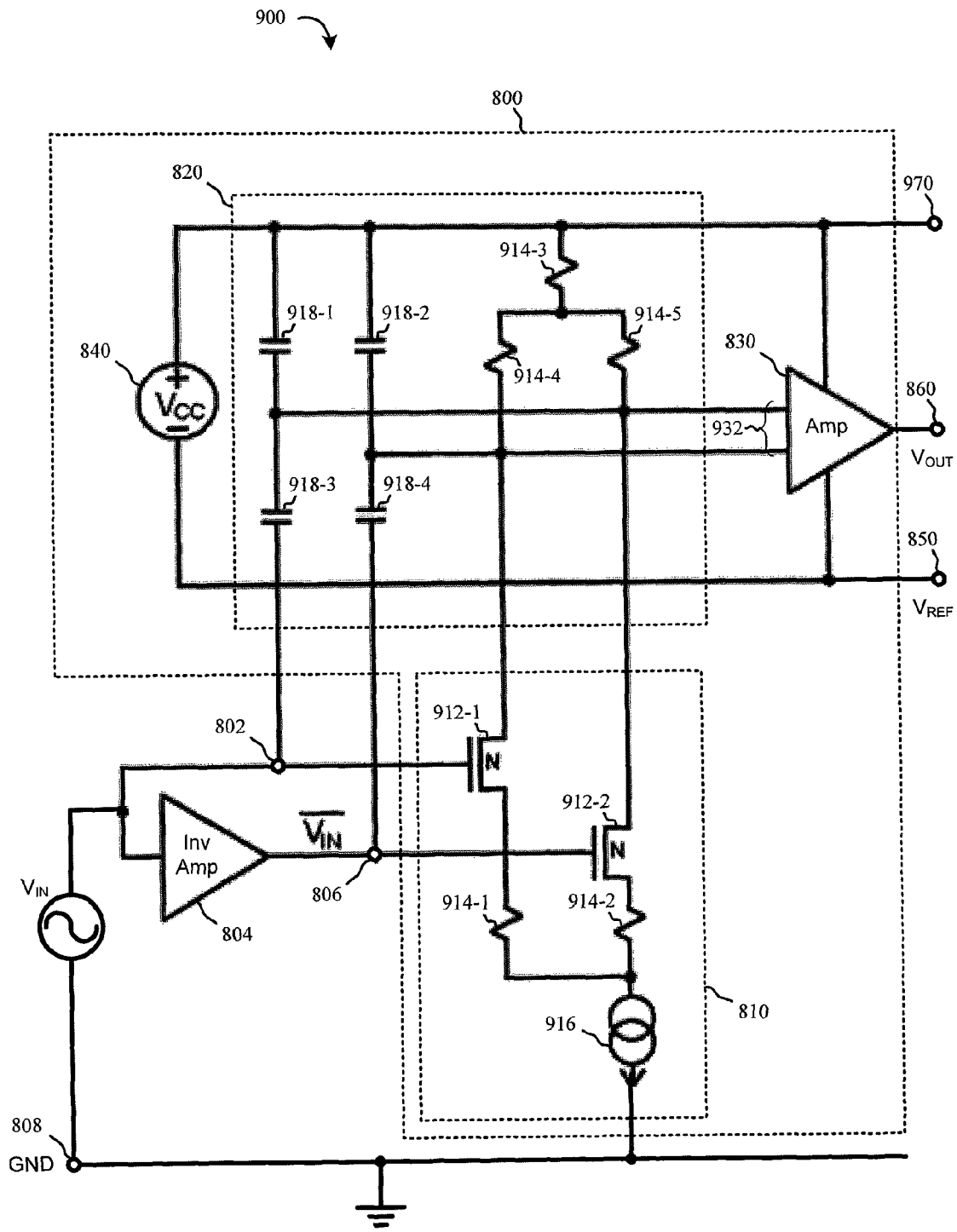
FIG. 9 shows a schematic view of an embodiment of an implementation of a voltage level shifter, like the one shown in FIG. 8, according to various embodiments of the invention.
Figure 10:
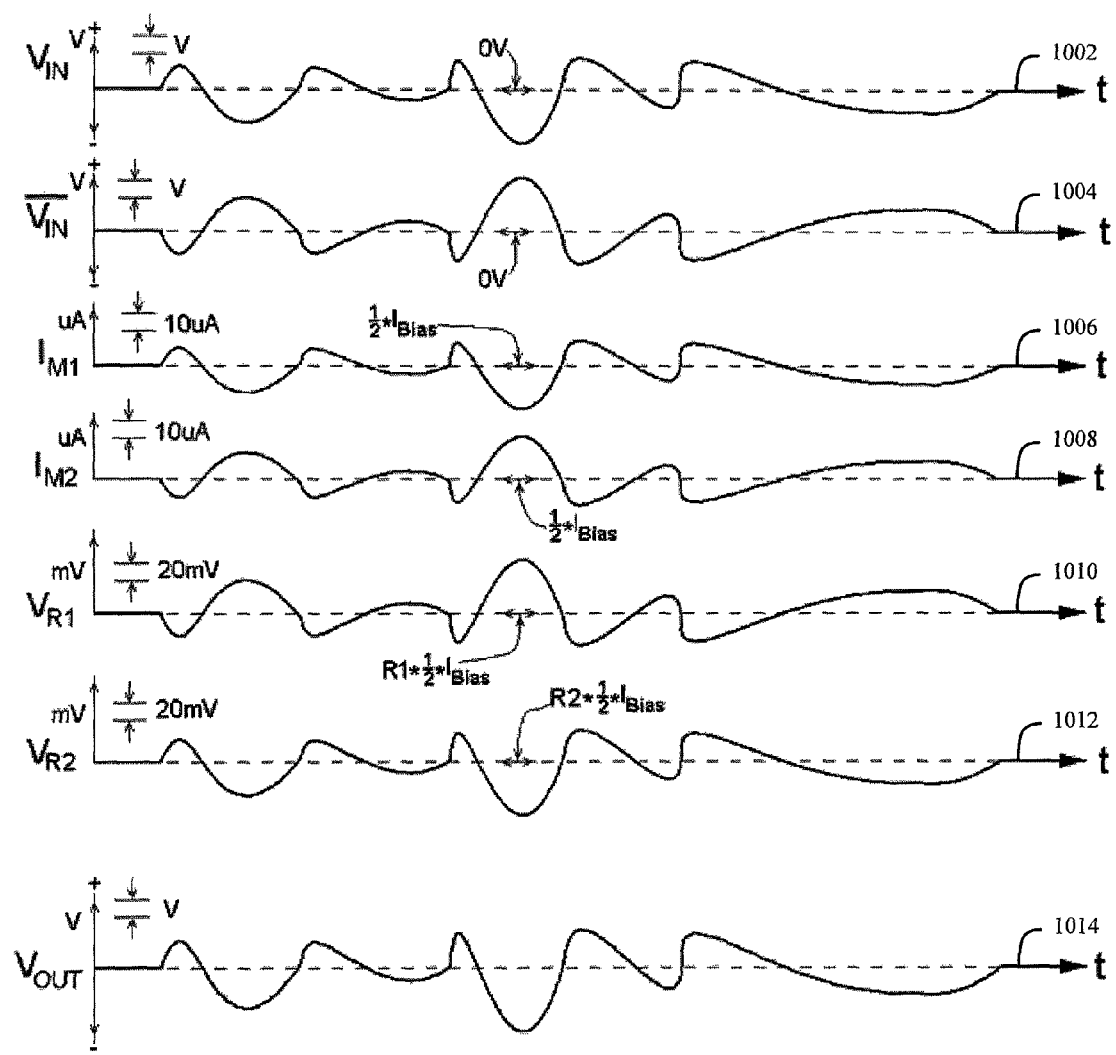
FIG. 10 shows graphs of illustrative waveforms of signals read at certain points in the voltage level shifter of FIG. 9.

FIG. 9 shows a schematic view of an embodiment of an implementation of the voltage level shifter 800 shown in FIG. 8, according to various embodiments of the invention. FIG. 10 shows graphs of illustrative waveforms of signals read at certain points in the circuit 900 of FIG. 9. For added clarity, FIGS. 9 and 10 will be discussed in parallel.

The voltage level shifter 800 may receive two complementary input voltages at a voltage-to-current converter unit 810. In some embodiments, the voltage-to-current converter unit 810 includes current gain components operable to receive voltage inputs and generate proportional current outputs. In one embodiment, the voltage-to-current converter unit 810 includes a first transistor 912-1, a second transistor 912-2, a first current transforming resistor 914-1, a second current transforming resistor 914-2, and a current source 916. The current source 916 may be configured to maintain a substantially constant bias current ("$I_{BIAS}$"), and may be tied to a voltage reference (e.g., ground 808).

In some embodiments, the input voltages are provided by receiving a voltage input signal 802 (e.g., an arbitrary, analog waveform), and passing the voltage input signal 802 through an inverting amplifier 804 to generate an inverted voltage input signal 806. The voltage input signal 802 and the inverted voltage input signal 806 may then be used as complementary input voltages. An illustrative embodiment of a voltage input signal 802 is shown in the first graph 1002 of FIG. 10, as an arbitrary, analog signal. An illustrative embodiment of a complementary voltage input signal 906 is shown in the second graph 1004 of FIG. 10, as an arbitrary, analog signal that is the complement of the signal shown in the first graph 1002.

In some embodiments, the voltage input signal 802 drives the gate of a first transistor 912-1, and the inverted voltage input signal 806 drives the gate of a second transistor 912-2. The first transistor 912-1 is in series with a first current transforming resistor 914-1, and the second transistor 912-2 is in series with a second current transforming resistor 914-2. In certain embodiments, the values of the current transforming resistors 914 are selected to provide high conductance with respect to the mutual conductance of the transistors 912. The current transforming resistors 914 may be tied to the current source 916. In this way, the gain of the transistors 912 may be substantially greater than the conductance of the current transforming resistors 914, which may allow the current through the transistors 912 to be substantially proportional to the voltages at their gates.

It will be appreciated that, in this configuration, the transistors 912 may be operable to provide complementary current signals that effectively represent the complementary voltage signals provided by the voltage input signal 802 and the inverted voltage input signal 806. Illustrative embodiments of a first generated current signal flowing through the first transistor 912-1 and a second generated current signal flowing through the second transistor 912-2 are shown in the third graph 1006 and the fourth graph 1008 of FIG. 10, respectively. It is worth noting that the first generated current signal and the second generated current signal straddle a current of $\frac{1}{2}*I_{BIAS}$, half of the current provided by the current source 916. As such, the addition of the first generated current signal to its complementary second generated current signal may result in a substantially constant current of $\frac{1}{2}*I_{BIAS}$.

Embodiments of the voltage level shifter 800 may receive the first generated current signal and the second generated current signal at a current-to-voltage converter unit 820. The current-to-voltage converter unit 820 may further receive the voltage input signal 802 and the inverted voltage input signal 806. The current-to-voltage converter unit 820 may include a first network of passive devices, including capacitor 918-1, capacitor 918-3, resistor 914-5, and resistor 914-3, and a second network of passive devices, including capacitor 918-2, capacitor 918-4, resistor 914-4, and resistor 914-3. The voltage input signal 802 and the second generated current signal may be used to control the first network of passive devices, thereby generating a first generated voltage signal. The inverted voltage input signal 806 and the first generated current signal may be used to control the second network of passive devices, thereby generating a second generated voltage signal.

In one embodiment, the voltage input signal 802 drives the gate of the first transistor 912-1 and the inverted voltage input signal 806 drives the gate of the second transistor 912-2. As the voltage input signal 802 increases, the first transistor 912-1 may allow more current to flow (i.e., the first generated current signal amplitude increases), thereby causing more current to flow through a first drain load resistor, resistor 914-4. At the same time, the increasing voltage input signal 802 may generate a decreasing inverted voltage input signal 806 (since the two voltages are complementary), which may decrease the current flow through the second transistor 912-2 and through a second drain load resistor, resistor 914-5. Because both resistor 914-4 and resistor 914-5 are in series with resistor 914-3, and both are in series with the current source 916 of the voltage-to-current converter unit 810, the current through resistor 914-3 may remain substantially constant. Resistor 914-3, capacitor 918-1, and capacitor 918-2 are further connected to a bias voltage source 840. The bias voltage source may be configured to generate a bias voltage 970 that is a given level above a reference voltage 850. As such, the voltage drop across resistor 914-3 may remain substantially constant, as determined by the current source 916 and the bias voltage source 840. For example, the value of resistor 914-3 may be chosen so that approximately half of the bias voltage (generated by the bias voltage source 840) will be dropped across resistor 914-3.

It is worth noting that the changes in the first generated current signal and the second generated current signal may cause positive and negative voltage transients across resistor 914-4 and resistor 914-5. The positive transients may be capacitively reinforced by capacitor 918-3 as a result of the voltage input signal 802, and the negative transients may be reinforced by capacitor 918-4 as a result of the inverted voltage input signal 806. For example, waveform distortion created by capacitor 918-1 and capacitor 918-2, those working with respect to load resistors resistor 914-4 and resistor 914-5, is cancelled by capacitor 918-3 and capacitor 918-4 (e.g., as a "feed-forward" circuit). This cancellation may be assisted by selecting values of various components such that, for example, the value of resistor 914-4 equals the value of resistor 914-5, the value of resistor 914-1 equals the value of resistor 914-2, and $$\frac{C_{918-3}}{C_{918-3}+C_{918-4}} = \frac{R_{914-4}}{R_{914-4}+R_{914-1}},$$

where, for example, "$C_{918-3}$" represents the value of capacitor 918-3.

It will be appreciated that the cancellation may not occur for the common mode voltage developed across resistor 914-3 with respect to the reference voltage 850. For example, this may be because the reference voltage 850 effectively acts as a common mode noise generator when the reference voltage 850 is floating. However, this may not adversely impact the output of the circuit, where the common mode voltage developed across resistor 914-3 remains less than the input common mode range of the gain stage 830 (e.g., within the common mode rejection capabilities of the gain stage 830). It is worth noting that the gain stage 830 may be connected between the bias voltage 970 and the reference voltage 850.

Illustrative embodiments of a first generated voltage signal across the first drain resistor, resistor 914-4, and a second generated voltage signal across the second drain resistor, resistor 914-5, are shown in the fifth graph 1010 and the sixth graph 1012 of FIG. 10, respectively. It is worth noting that the first generated voltage signal straddles a voltage calculated as the value of resistor 914-4 times half of the bias current (i.e., $R_{914-4}*\frac{1}{2}*I_{BIAS}$), and the second generated voltage signal straddles a voltage calculated as the value of resistor 914-5 times half of the bias current (i.e., $R_{914-5}*\frac{1}{2}*I_{BIAS}$). As such, if resistor 914-4 and resistor 914-5 are selected to be of equal value and the second generated voltage signal is subtracted from its complementary first generated voltage signal, a differential voltage response 932 may be calculated as the value of resistor 914-3 times the bias current (i.e., $R_{914-3}*I_{BIAS}$).

In some embodiments, the differential voltage 932 may be used to drive a gain stage 830. The gain stage 830 may include a differential amplifier, an analog to digital converter, or any other compatible component. The gain stage 830 may be used for any of various functions, including to generate an output voltage 860 from the differential voltage 932, to affect the gain (e.g., to amplify) the output voltage 860, to impedance match the output voltage 860, etc.

In certain embodiments, the gain stage 830 is tied between the bias voltage and the reference voltage 850, via the bias voltage source 840. In certain embodiments, the reference voltage 850 is tied to a hard point (e.g., a ground reference), while in other embodiments, the reference voltage 850 floats. Because the gain stage 830 is referenced to the reference voltage 850, the voltage output signal 860 may float on the reference voltage 850. So long as the gain stage 830 has sufficient common-mode rejection capabilities, this may allow the gain stage 830 to effectively reject fluctuations in the reference voltage 850. This, in turn, may allow information from the voltage output signal 860 to be used without being affected by fluctuations in the reference voltage 850 in undesirable ways. The output voltage, then, may look like the waveform shown in the seventh graph 1014 of FIG. 10. As shown, the output voltage waveform shown in graph 1014 may retain substantially all the information of the input voltage waveform shown in graph 1002. Notably, however, the waveforms may ride on different reference levels. For example, while the input voltage waveform may ride on a relatively stable chassis ground, the output level may ride on a widely fluctuating floating ground reference.

Figure 11:
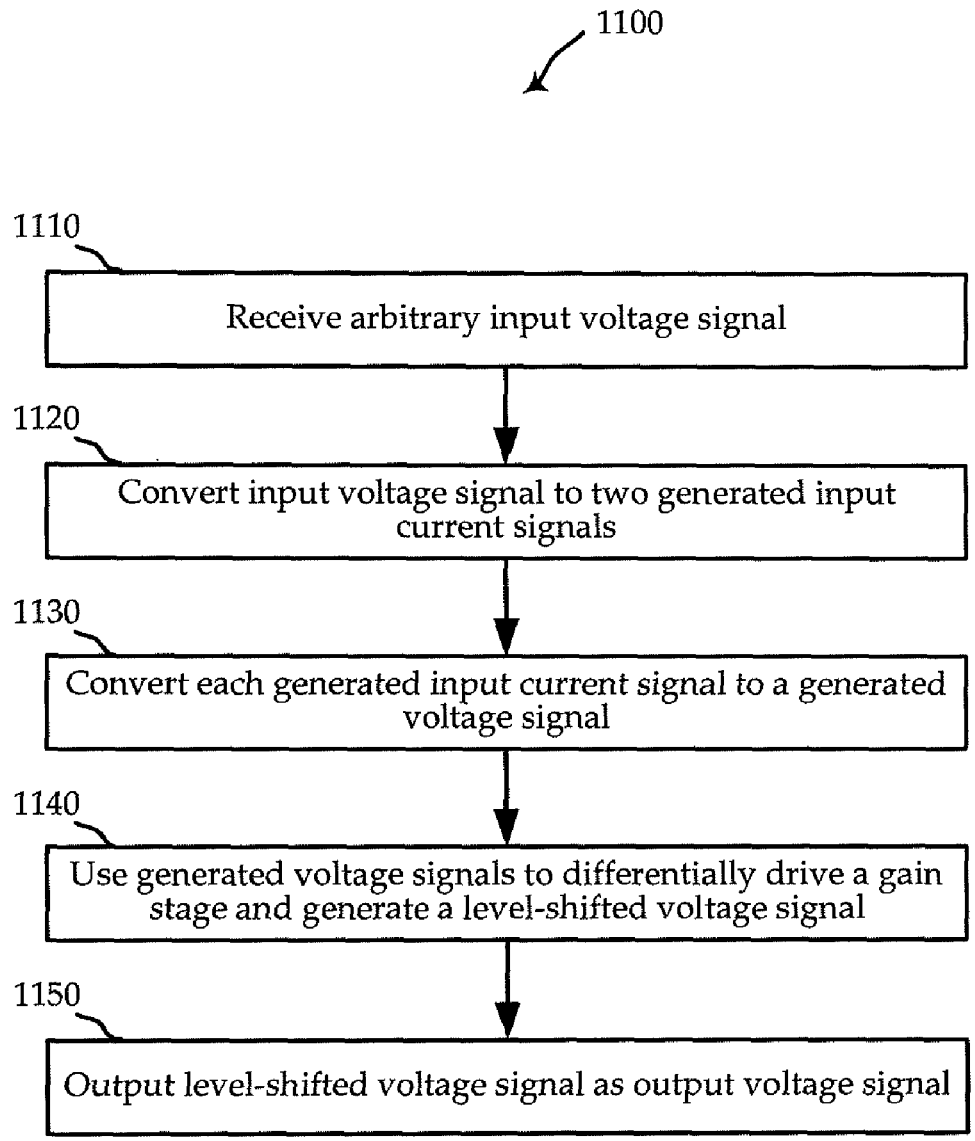
FIG. 11 shows a flow diagram of exemplary methods for using a voltage level shifter with arbitrary input signals, according to embodiments of the invention.

FIG. 11 shows a flow diagram of exemplary methods for using a voltage level shifter, according to embodiments of the invention. The method 1100 begins by receiving an arbitrary input voltage signal at block 1110. At block 1120, the arbitrary input voltage signal is converted (e.g., transformed) into at least one generated current signal that represents the information from the arbitrary input voltage signal. At block 1130, the at least one generated current signal is converted into at least one generated voltage signal. The at least one generated voltage signal is used to differentially drive a gain stage and generate a level-shifted voltage signal at block 1140. The level shifted voltage may be output at block 1150 as an output voltage.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems, methods, and software may individually or collectively be components of a larger system, wherein other procedures may take precedence over or otherwise modify their application. Also, a number of steps may be required before, after, or concurrently with the following embodiments.

Specific details are given in the description to provide a thorough understanding of the embodiments. However, it will be understood by one of ordinary skill in the art that the embodiments may be practiced without these specific details. For example, well-known circuits, processes, algorithms, structures, waveforms, and techniques have been shown without unnecessary detail in order to avoid obscuring the embodiments. It will be further understood by one of ordinary skill in the art that the embodiments may be practiced with substantial equivalents or other configurations. For example, circuits described with reference to N-channel transistors may also be implemented with P-channel devices, using modifications that are well known to those of skill in the art.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered.

Accordingly, the above description should not be taken as limiting the scope of the invention, as described in the following claims:

What is claimed is:

1. A switching circuit system, comprising:
an input module, operable to receive a two-level input signal representing input information, and to generate a first switching voltage signal and a second switching voltage signal as a function of the input signal;
a current signal generator module, comprising:
a first current switching device, operable to generate a first switching current signal as a function of the first switching voltage signal; and
a second current switching device, operable to generate a second switching current signal as a function of the second switching voltage signal;
a first precharging device, coupled with the first current switching device and the second current switching device, and operable to build up a charge reserve when the second switching voltage signal is HIGH, and to dump at least a portion of the charge reserve into the first current switching device when the first switching voltage signal is HIGH;
a second precharging device, coupled with the first current switching device and the second current switching device, and operable to build up a charge reserve when the first switching voltage signal is HIGH, and to dump at least a portion of the charge reserve into the second current switching device when the second switching voltage signal is HIGH;
a voltage signal generator module, operable to generate a first voltage response as a function of the first switching current signal and to generate a second voltage response as a function of the second switching current signal; and
a latching module, operable to generate a two-level latched signal as a function of the first voltage response and the second voltage response, such that the latched signal substantially preserves the input information represented by the input signal.

2. The circuit switching system of claim 1, wherein the latching module comprises:
a digital latching device, operable to toggle the latched signal from a first logic level to a second logic level when the first voltage response goes HIGH and to toggle the latched signal from the second logic level back to the first logic level when the second voltage response goes HIGH.

3. The circuit switching system of claim 1, wherein the latching module comprises:
a comparator device, operable to:
receive the first voltage response and the second voltage response differentially;
transition the latched signal from a first logic level to a second logic level when the first voltage response exceeds the second voltage response by a first threshold amount; and
transition the latched signal from the second logic level to the first logic level when the second voltage response exceeds the first voltage response by a second threshold amount.

4. The circuit switching system of claim 1, wherein the input module comprises:

an inverter device, configured to invert the input signal, such that the second switching voltage signal is substantially an inverted version of the first switching voltage signal.

5. The circuit switching system of claim 1, wherein the current signal generator module further comprises:
a current source, operable to provide a substantially constant bias current to a source terminal of the first current switching device and a source terminal of the second current switching device;
a first resistive device, coupled with a drain terminal of the first current switching device and a circuit switching node;
a second resistive device, coupled with a drain terminal of the second current switching device and the circuit switching node; and
a third resistive device, coupled between a source voltage level and the circuit switching node,
wherein the input signal has a period, the first current switching device is ON for substantially a first half of the period, and the second current switching device is ON for a second half of the period, such that the bias current flows through the first resistive device and the third resistive device for substantially the first half of the period, and the bias current flows through the second resistive device and the third resistive device for substantially the second half of the period, and
wherein the first voltage response is functionally related to a voltage across the first resistive device and the second voltage response is functionally related to a voltage across the second resistive device.

6. The circuit switching system of claim 1, wherein:
the first precharging device is a first capacitive device having:
a first terminal coupled with a gate terminal of the first current switching device; and
a second terminal coupled with a drain terminal of the second current switching device and a first input terminal of the latching module; and
the second precharging device is a second capacitive device having:
a first terminal coupled with a gate terminal of the second current switching device; and
a second terminal coupled with a drain terminal of the first current switching device and a second input terminal of the latching module.

7. The circuit switching system of claim 6, further comprising:
a third capacitive device coupled between a source voltage level and the second terminal of the first capacitive device; and
a fourth capacitive device coupled between the source voltage level and the second terminal of the second capacitive device.

8. The circuit switching system of claim 1, further comprising:
a high-side switching device, coupled between a source voltage level and an output voltage level, and configured to be switched as a function of the latched signal and to pull the output voltage level substantially to the source voltage level when the high-side switching device is ON.

9. The circuit switching system of claim 8, further comprising:
a driver module, communicatively coupled with the latching module, and operable to generate a driver signal as a function of the latched signal, the driver signal being configured to switch the high-side switching device,
wherein the high-side switching device is configured to be switched as a function of the driver signal.

10. The circuit switching system of claim 8, further comprising:
a low-side switching device, coupled between the output voltage level and a ground level, and configured to be switched as a function of a low-side driver signal and to pull the output voltage level substantially to the ground voltage level when the low-side switching device is ON.

11. The circuit switching system of claim 10, further comprising:
a low-side driver module, operable to receive a low-side input signal and generate the low-side driver signal as a function of the low-side input signal.

12. The circuit switching system of claim 11,
wherein the low-side driver module is operable to generate the low-side driver signal, such that the low-side switching device is switched ON only when the high-side switching device is OFF.

13. The circuit switching system of claim 10, wherein:
the high-side switching device and the low-side switching device are configured in a half-bridge topology.

14. The circuit switching system of claim 1, further comprising:
a packaging, configured to house at least the input module, the current signal generator module, first precharging device, the second precharging device, and the voltage signal generator module, the packaging comprising at least one interface terminal configured to communicatively couple the input module with a source of the input signal located external to the packaging.

15. A switching circuit system, comprising:
means for receiving a two-level input signal representing input information;
means for generating a first response signal as a function of the input signal, the first response signal comprising a first exponential response defined substantially as a voltage across a first network in response to a switched current applied to the first network, the first network consisting of a first resistive load coupled in parallel with a first capacitive load;
means for generating a second response signal as a function of the input signal, the second response signal comprising a second exponential response defined substantially as a voltage across a second network in response to a switched voltage applied across a third network, the second network consisting of a second resistive load coupled in parallel with a second capacitive load, and the third network consisting of a third capacitive load coupled in series with the second network;
means for generating a combined response signal being substantially a superposition of the first response signal and the second response signal; and
means for generating a high-side driver signal as a function of the combined response signal, such that the high-side driver signal substantially preserves the input information represented by the input signal, and such that the first exponential response and the second exponential response are substantially absent from the high-side driver signal.

16. The circuit switching system of claim 15, wherein:
the first resistive load is equivalent to the second resistive load; and
the first capacitive load is equivalent to the second capacitive load.

17. The circuit switching system of claim 15, wherein:
the means for generating a combined response is configured to generate the combined response signal by isolating the first exponential response and the second exponential response substantially to a common mode of the combined response signal; and
the means for generating a high-side driver signal is configured to generate the high-side driver signal by rejecting the common mode of the combined response signal, such that the first exponential response and the second exponential response are substantially absent from the high-side driver signal.

18. The circuit switching system of claim 15, further comprising:
means for switching an output level to a source voltage level as a function of the high-side driver signal.

19. The circuit switching system of claim 18, further comprising:
means for generating a low-side driver signal configured to be HIGH only when the high-side driver signal is LOW; and
means for switching the output level to a ground level as a function of the low-side driver signal.

20. The circuit switching system of claim 15, further comprising:
means for housing at least the means for receiving a two-level input signal, the means for generating a first response signal, the means for generating a second response signal, and the means for generating a combined response,
wherein the means for housing comprises a means for providing a communicatively coupling between the first means and a source of the input signal located external to the means for housing.

21. A method for voltage level shifting, comprising:
receiving a two-level input signal representing input information;
generating a first response signal as a function of the input signal, the first response signal comprising a first exponential response defined substantially as a voltage across a first network in response to a switched current applied to the first network, the first network consisting of a resistive load coupled in parallel with a first capacitive load;
generating a second response signal as a function of the input signal, the second response signal comprising a second exponential response defined substantially as a voltage across the first network in response to a switched voltage applied across a second network, the second network consisting of a second capacitive load coupled in series with the first network;
generating a combined response signal being substantially a superposition of the first response signal and the second response signal; and
generating a high-side driver signal as a function of the combined response signal, such that the high-side driver signal substantially preserves the input information represented by the input signal, and such that the first exponential response and the second exponential response are substantially absent from the high-side driver signal.

22. The method of claim 21, wherein:
generating the first response signal as a function of the input signal comprises:
generating a first switching voltage signal and a second switching voltage signal as a function of the input signal;
generating a first switching current signal as a function of the first switching voltage signal; and
generating a second switching current signal as a function of the second switching voltage signal; and
generating the second response signal as a function of the input signal comprises:
when the second switching voltage signal is HIGH, building up a first charge reserve on a first precharging device and dumping at least a portion of a second charge reserve into the second current switching device; and
when the first switching voltage signal is HIGH, building up the second charge reserve on a second precharging device and dumping at least a portion of the first charge reserve into the first current switching device.

23. The method of claim 21, wherein:
generating the combined response signal comprises:
receiving the first response signal and the second response signal differentially; and
isolating the first exponential response and the second exponential response substantially to a common mode of the combined response signal; and
generating the high-side driver signal as a function of the combined response signal comprises rejecting the common mode of the combined response signal, such that the first exponential response and the second exponential response are substantially absent from the high-side driver signal.

24. The method of claim 21, wherein:
the combined response signal is defined substantially by the equation:

$$I_{IN}(t=0^+) * R_L * \left(1 - e^{-t*\left(\frac{1}{R_L*C_L}\right)}\right) + V_{IN}(t=0^+) * \left(\frac{C1}{C_L}\right) + \left(e^{-t*\left(\frac{1}{R_L*C_L}\right)}\right),$$

$R_L$ is a resistance of the resistive load;
$C_1$ is a capacitance of the first capacitive load;
$C_L$ is a capacitance of the first capacitive load plus a capacitance of the second capacitive load;
t is a time measure;
$I_{IN}$ is a magnitude of the switched current over the time measure, wherein $I_{IN}$ transitions from substantially a zero level to a positive level at t=0; and
$V_{IN}$ is a magnitude of the switched voltage over the time measure, wherein $V_{IN}$ transitions from substantially a zero level to a positive level at t=0.

* * * * *